US010547332B2

(12) United States Patent
Litsyn et al.

(10) Patent No.: US 10,547,332 B2
(45) Date of Patent: Jan. 28, 2020

(54) DEVICE, SYSTEM AND METHOD OF IMPLEMENTING PRODUCT ERROR CORRECTION CODES FOR FAST ENCODING AND DECODING

(71) Applicant: Tsofun Algorithm Ltd., Tel Aviv (IL)

(72) Inventors: Simon Litsyn, Tel Aviv (IL); Noam Presman, Givatayim (IL)

(73) Assignee: Tsofun Algorithm Ltd., Tel Aviv (IL)

( * ) Notice: Subject to any disclaimer, the term of this patent is extended or adjusted under 35 U.S.C. 154(b) by 0 days.

(21) Appl. No.: 15/422,174

(22) Filed: Feb. 1, 2017

(65) Prior Publication Data

US 2018/0219561 A1    Aug. 2, 2018

(51) Int. Cl.
*H03M 13/00* (2006.01)
*H03M 13/29* (2006.01)

(52) U.S. Cl.
CPC ..... *H03M 13/2948* (2013.01); *H03M 13/293* (2013.01); *H03M 13/2915* (2013.01)

(58) Field of Classification Search
CPC ........... H03M 13/2909; H03M 13/154; H03M 13/2948
See application file for complete search history.

(56) References Cited

U.S. PATENT DOCUMENTS

| | | | | |
|---|---|---|---|---|
| 4,719,628 A * | 1/1988 | Ozaki | ................... | H03M 13/15 714/755 |
| 5,559,506 A * | 9/1996 | Leitch | ............... | H03M 13/2703 340/7.43 |
| 6,415,411 B1 * | 7/2002 | Nakamura | ........ | H03M 13/2909 714/755 |
| 7,181,669 B2 * | 2/2007 | Shen | ................. | H03M 13/2707 714/755 |
| 7,346,829 B2 * | 3/2008 | Riho | ................... | G06F 11/1012 365/201 |

OTHER PUBLICATIONS

Lin et al., Error Control Coding, $2^{nd}$ Edition, Pearson Prentice Hall, Pearson Education, Inc., Upper Saddle River, NJ 07458, 2004.
Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Jul. 2009.

(Continued)

*Primary Examiner* — Christine T. Tu
(74) *Attorney, Agent, or Firm* — Pearl Cohen Zedek Latzer Baratz LLP

(57) ABSTRACT

A device, system and method for decoding a product code generated by encoding input data by a plurality of first and second dimension error correction codes. For each of a plurality of first dimension codewords, the first dimension input data codeword may be decoded using a first dimension error correction code and the first dimension codeword may be erased if errors are detected in the decoded first dimension codeword. For each of a plurality of second dimension codewords, the second dimension codeword may be decoded using a second dimension erasure correction code to recover an erasure in the second dimension codeword that was erased in the first dimension decoding.

25 Claims, 17 Drawing Sheets

(56) References Cited

OTHER PUBLICATIONS

Dumer, "Concatenated Codes and Their Multilevel Generalizations", Handbook of Coding Theory, Editors: V.S. Pless and W.C. Huffman, Eds., Elsevier, The Netherlands, 1998, pp. 1-66.
Mukhtar el al., "Turbo Product Codes: Applications, Challenges, and Future Directions," IEEE Communications Surveys & Tutorials, vol. 18, No. 4, pp. 3052-3069, Fourth Quarter 2016.
Lin et al., Error Control Coding: Fundamentals and Applications, Prentice-Hall Computer Applications in Electrical Engineering Series, Prentice-Hall, Inc., Englewood Cliffs, NJ 07632, USA, 1983.

\* cited by examiner

702

Input: $K$ information symbols, denoted as $u \in F^K$.
Output: The main information matrix of $k$ columns and $(m + p)$ rows, denoted as $M$.

704

1. Initialize $\mathcal{A}$ to be equal to the set $\{0,1,2,...K-1\}$.
2. For each $j = 0,1,2,...,r-1$
   - Initialize an empty matrix of 0 rows and $k_j$ columns denoted as $\widehat{M}^{(j)}$ (will be used for the user information part)
3. For each $j = 0,1,2,...,r-1$
   - Initialize an empty matrix of 0 rows and $k_j$ columns denoted as $\widetilde{M}^{(j)}$ (will be used for the parity of the erasure correction matrix).
4. Initialize $M$ as an empty matrix having 0 rows and $k$ columns (will be used as the main information matrix).

710

$0 < d_{r-2} < d_{r-3} < \cdots < d_1 < d_0 \leq p$
$d_{r-1} \triangleq 0, d_r \triangleq -m$

706

$\kappa^{(i)} \triangleq \sum_{\ell=0}^{i-1} k_\ell$ for $i = 1,2,...,r$
$\kappa^{(0)} \triangleq 0$.

708

For each $j = 0,1,2,...r-1$:
1. Pick a subset of $\mathcal{A}$ of $(d_{r-j-1} - d_{r-j}) \cdot \kappa^{(r-j)}$ symbols and denote it as $\mathcal{A}^{(j)}$. Remove $\mathcal{A}^{(j)}$ from $\mathcal{A}$, i.e. $\mathcal{A} \leftarrow \mathcal{A} \setminus \mathcal{A}^{(j)}$.
2. Reshape the subvector of $u$ of indices from $\mathcal{A}^{(j)}$ into a matrix $B$ of $(d_{r-j-1} - d_{r-j})$ rows and $\kappa^{(r-j)}$ columns.
3. For $i = 0,1,2,...,j-1$
   - Concatenate to $B$ the next $(d_{r-j-1} - d_{r-j})$ rows of the erasure parity submatrix $\widetilde{M}^{(r-1-i)}$ (increasing the number of columns of $B$) and remove these rows from $\widetilde{M}^{(r-1-i)}$.
4. Concatenate $B$ to $M$ (i.e. $M \leftarrow [M;B]$). As a consequence the bottom $d_{r-j-1} - d_{r-j}$ rows of $M$ are $B$.
5. For $i = 0,1,2,...r-j-1$
   - Let $\widehat{B}$ be a submatrix of $B$ having columns in the range $\kappa^{(i-1)}$ to $\kappa^{(i)} - 1$.
   - Concatenate $\widehat{B}$ as the last rows of $\widehat{M}^{(i)}$, i.e. $\widehat{M}^{(i)} \leftarrow [\widehat{M}^{(i)}; \widehat{B}]$.
6. Divide each row of the matrix $\widetilde{M}^{(r-1-j)}$ into sub-vectors of $\ell_{r-1-j}$ symbols (mega-symbols).
7. Apply on each mega-column of the matrix $\widetilde{M}^{(r-1-j)}$ a systematic erasure correction code of $p - d_{r-1-j}$ symbols parity, such that mega-column $\ell$ of $\widetilde{M}^{(r-1-j)}$ has parity $v^{(\ell)}$. Let $\widetilde{M}^{(r-1-j)}$ be $(p - d_{r-1-j}) \times k_j$ matrix of which mega-column $\ell$ is $v^{(\ell)}$.

712

If $d_0 < p$

1. Let $B$ be a concatenation of the columns of the $\widetilde{M}^{(j)}$ matrices column by column, i.e.

$$B \leftarrow [\widetilde{M}^{(0)}, \widetilde{M}^{(1)}, \widetilde{M}^{(2)}, ..., \widetilde{M}^{(r-1)}]$$

2. Concatenate $B$ to $M$ (i.e. $M \leftarrow [M;B]$). As a consequence the bottom $p - d_0$ rows of $M$ are $B$.

Figure 7

DEVICE, SYSTEM AND METHOD OF IMPLEMENTING PRODUCT ERROR CORRECTION CODES FOR FAST ENCODING AND DECODING

FIELD OF THE INVENTION

Embodiments of the invention relate to devices, systems and methods for encoding and/or decoding error correction codes, and, in particular, product error correction codes.

BACKGROUND OF THE INVENTION

A fundamental problem in digital communication and data storage is that data transmitted over a noisy channel or storage media may be retrieved with errors. A common solution to this problem is to add redundancy information to the data, referred to as Error Correcting Codes (ECC) or Error Control Codes, to correct the errors and enable reliable communication in the presence of channel interference. According to this technique, the receiver, which only has access to the noisy version of the received signal, may use the added redundancy (provided by the ECC) to correct errors and reconstruct the original version of the information as it was transmitted.

Current demand for increased throughput of communication over various communication media (e.g., satellite, wireless and optical) and increased density of data stored in nonvolatile memory modules (e.g., flash memory) poses growing challenges for error correction systems. At the same time, current system standards are increasing requirements for data fidelity and reliability over those systems (see e.g. high data fidelity requirements for nonvolatile memory modules or high throughput requirements for optical communication devices). For example, current Flash memory specifications require block error probability to be less than $10^{-11}$.

Consequently, there is a growing need in the art for systems and methods to efficiently encode and decode error correction codes to provide relatively high throughput or data density, while maintaining low decoding error rates.

SUMMARY OF EMBODIMENTS OF THE INVENTION

A device, system and method for implementing a two-pass decoder. In a first pass, the two-pass decoder may decode a first dimension of a product code and serves as an erasure "channel" that inserts erasures where decoding fails in the first dimension. In a second pass, the two-pass decoder may decode a second dimension of a product code and serves as an erasure corrector that corrects erasures inserted in the first pass. In some embodiments, the two-pass decoder may repeat one or more iterations of the first and/or second passes if the product code contains errors after the first iteration of the first and/or second passes. In one embodiment, the two-pass decoder may repeat the first pass if the initial iteration of the first pass failed and the second pass succeeded, for example, to propagate any erasure corrections in the second pass to increase the probability of successfully decoding a first dimension code that failed in the first pass. In some embodiments, the two-pass decoder may repeat the second pass if errors remain after the current iteration of the first pass.

A device, system and method for decoding a product code. The product code may encode codewords by a plurality of first and second dimension error correction codes. For each of a plurality of first dimension codewords, the first dimension codeword may be decoded using a first dimension error correction code and the first dimension codeword may be erased if errors are detected in the decoded first dimension codeword. For each of a plurality of second dimension codewords, the second dimension codeword may be decoded using a second dimension erasure correction code to correct an erasure in the second dimension codeword that was erased in the first dimension decoding.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 6 and FIG. 7 are flowcharts of processes for generating a data structure, for example, an information matrix M such as is used in the processes of FIG. 4 and FIG. 5, for encoding a product code according to some embodiments of the invention;

Figure 1A:
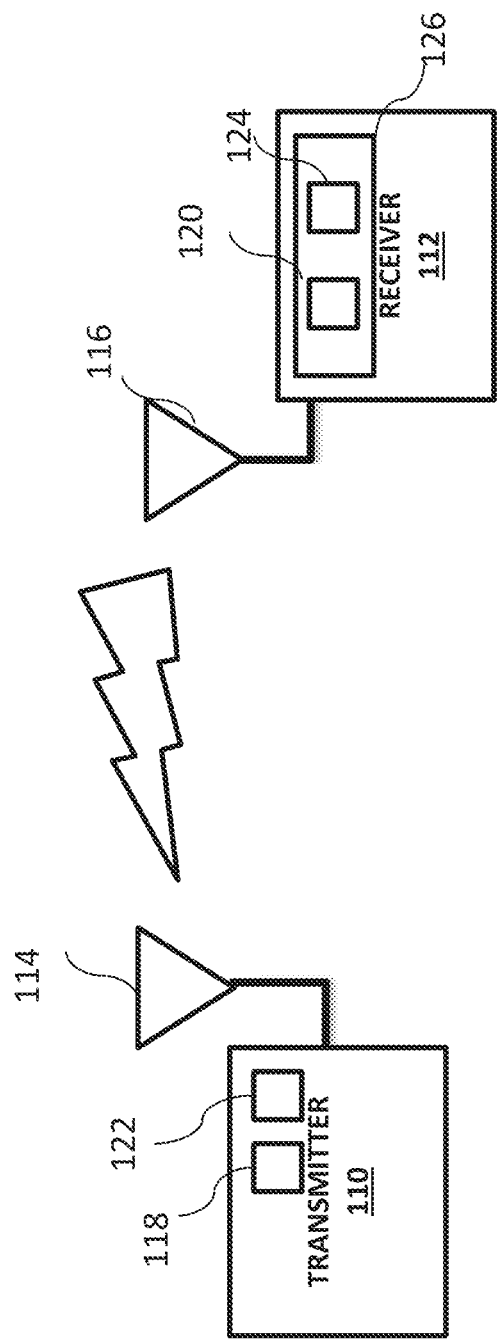
FIG. 1A is a schematic illustration of a communication system comprising an ECC encoder and/or decoder operating according to some embodiments of the invention.

It will be appreciated that for simplicity and clarity of illustration, elements shown in the FIGS. have not necessarily been drawn to scale. For example, the dimensions of some of the elements may be exaggerated relative to other elements for clarity. Further, where considered appropriate, reference numerals may be repeated among the FIGS. to indicate corresponding or analogous elements.

DETAILED DESCRIPTION OF EMBODIMENTS OF THE INVENTION

A channel may distort data in several ways. One type of distortion inserts errors into a data signal, e.g., by changing values of the received data in unknown places. For example, a codeword transmitted as [1 0 0 0 1 1] may be received as [1 0 0 1 0 1](changing the values of the fourth and fifth terms). Another type of distortion replaces some of the positions of the vector values by a new symbol referred to as an "erasure" (e.g., leaving the other symbols unchanged). For example, a codeword transmitted as [1 0 0 0 1 1] may be received as [1 0 0 e e 1] (the fourth and fifth terms are marked by an erasure, "e"). Other types of distortions may occur, including, for example, adding extra values, swapping values, etc.

"Error Detection Codes" (EDC) may refer to codes, vectors, or redundancy information, for detecting errors in an associated code (e.g., accidental changes in one or more values of the associated code's vector). Error Detection Code typically only has enough redundancy information to detect, but not to correct, a certain set of errors. Examples of EDC include repetition codes, parity bits, checksums, cyclic redundancy checks, and cryptographic hash functions (other EDC may also be used). Parity bits may be used to verify a linear constraint on the code symbols (e.g., that an associated codeword has even or odd hamming weight).

"Error Correcting Codes" (ECC) or "Error Control Codes" (ECC) may refer to codes or a collection of codewords, vectors, or redundancy information, for correcting errors in an associated code. ECC may be appended to, or stored with, the associated information to be corrected, or may be stored or transmitted separately. Examples of ECC include BCH codes, Reed-Solomon (RS) codes, Convolution codes, Turbo codes, Low Density Parity Check codes (LDPC) and Polar codes (other ECC may also be used) for correcting errors in an error correction process. An example of an error decoding process is the read operation in storage implementation (e.g., Flash memories). The data retrieved from the storage medium may be distorted due to physical interferences occurring in the device. When the user data is protected with an appropriate error correction code, the flash controller may still fix certain cases of errors (e.g., the most probable set) thereby leaving the user with a relatively small decoding failure probability.

ECCs may have both correction and detection capabilities. In some embodiments of the invention, ECC may be re-used for error detection (in addition to error correction) instead of using separate EDC for error detection. Such embodiments may provide a more compact encoding by eliminating separate EDC, thereby reducing the overall storage requirements for the codewords.

"Erasure correction codes" or "erasure codes" may refer to ECC for correcting erasures. Erasures may refer to codes in which a codeword value (e.g., "0" or "1") is erased and/or replaced by an erasure value (e.g., "e"). Decoding erasure codes is typically simpler and faster than decoding standard ECC because erasure codes define codes as either an error (e.g., erased, "e") or validated (e.g., not erased, "0" or "1") symbols. In standard ECC decoding, a decoder maintains a probability of error for each symbol and performs complex computations to determine if a symbol is correct or not (e.g., maximum likelihood (ML) computations enumerating all possibilities of a symbol value to determine a closest or most likely codeword to a noisy word, such as, based on a smallest number of bit flips between sent and received codewords). Correcting erasure codes is typically simpler than standard (e.g., maximum likelihood) ECC decoding, for example, equivalent to solving a system of N equations with a set of N (or fewer) unknowns (erasures). Erasure codes are limited in the number of erasures that can be corrected (e.g., in maximum distance separable (MDS), erasure codes of length or parity (p) may recover up to (p) erasures). Examples of erasure codes are BCH codes, Reed-Solomon (RS) codes, Low Density Parity Check codes (LDPC), Tornado Codes, LT Codes, Raptor Codes and Polar codes (other erasure codes may be used) used to correct erasures in an erasure correcting process. An example of an erasure decoding process is in multiple-storage device applications in which there may be a need to quickly recover from a possible failure of a certain number of storage devices (e.g., one or more storage servers, SSDs, HDDs, etc.). In such cases, the system may use an erasure correction code, in which different symbols of the code are stored on different media devices (e.g., for m devices, each media chunk may be divided into m–p sub-chunks that are encoded with erasure correction code with p parity symbols, and each chunk may then be stored on one of those m devices). In case a storage device fails, all the symbols that were stored on that device are set to erasures. Erasure correction code enables recovery of the missing device data without having to revert to backup restoration.

In accordance with some embodiments of the present invention, a device, system and method is provided for a family of Error Correcting Codes (ECC) that quickly and efficiently encodes and decodes while providing low error rates. This family of error correction codes is referred to as "product codes." Product codes are composed of a plurality of row codes (e.g., in a first dimension) and a plurality of columns codes (e.g., in a second dimension). Row codes may be orthogonal to, and encoded and/or decoded independently of, column codes. Each data element in a product code may be encoded twice, once in a first dimension by a row code and then again in a second dimension by a column code, where the row and column codes intersect the data element. Product code structure has an advantage that it is composed of relatively shorter constituent error correction codes (e.g., row codes and column codes) compared to a linear code of comparable encoding information, and may thus be decoded by relatively simple or shorter corresponding decoding algorithms because the complexity or computing time of decoders is typically dependent on code length. For example, consider the case that the consumed memory of the decoder is $S(N)=c \cdot N$ and the decoding time of a decoder is $f(N)=N \cdot g(N)$ where c is constant and $g(N)$ is at most a linear function of the code of length N (e.g., $g(N)=\log_2 N$ or $g(N)=N^{0.5}$). Consequently, decreasing the length of the code to $$\frac{N}{\alpha},$$

reduces the memory requirement by a multiplicative factor of $\alpha>1$ and the decoding time by a multiplicative factor of $$\left( \alpha \cdot \frac{g(N)}{g\left(\frac{N}{\alpha}\right)} \leq \alpha \right).$$

In other words, by decreasing the length of the ECC from a linear code, product codes may reduce the memory complexity and decoding time of the decoder compared to a decoder that is employed on the entire comparable linear code. Note, however, that decoding a product code with length N and m row constituent codes (e.g., each one of length $$\frac{N}{\alpha}$$

where α=m) may have a higher frame error rate, compared to decoding systems that use a single code of length N. Moreover, by dividing a product code into row and column codes, it is possible to employ a plurality of decoders for decoding a plurality of respective row codes and/or column codes in parallel, thereby increasing the throughput of the decoder (e.g., approximately multiplying the throughput by the number of parallel decoders) and decreasing the decoding time of the product code (e.g., approximately dividing the decoding time by the number of parallel decoders). Row and column codes may also implement different types of ECC for row and column codes (e.g., in different dimensions), for example, to gain the benefits of both high accuracy codes (e.g., parity row codes) and high-speed codes (e.g., erasure column codes). Product codes, according to some embodiments of the invention, may use the following types of codes as their constituent codes: (i) erasure correction codes (e.g., column codes), (ii) error correction codes (e.g., row codes) that may be concatenated with additional error detection codes. In some embodiments, erasure correction codes may serve a dual purpose of correcting and detecting errors, in which case separate error detection code may not be used.

An insight according to some embodiments of the invention is that erasure decoding is beneficial as a supplemental or second-pass decoding step, used in conjunction with another primary or first-pass decoding step. Erasure correction codes are typically only capable of correcting a specific type of interference that introduces erasures into a signal over an erasure channel. Thus, conventional decoders use standard (non-erasure) error correction decoding in the more typical type of interference that introduces errors (not erasures) into a signal. However, according to embodiments of the present invention, a two-pass decoder is provided in which the first-pass decoder is the erasure "channel" that inserts erasures into the codeword during this first-pass internal decoding method. The first-pass decoder may decode more general errors, and insert erasures where the first-pass decoding fails. The second-pass decoder may then perform erasure decoding to correct the erasures introduced by the first-pass decoding.

Product codes may support two such passes, dimensions, or layers, of decoding. According to some embodiments of the invention, there is now provided a device, system and method for encoding/decoding a product code comprising a first pass, layer, or dimension of ECC (e.g., row codes) to correct a first set (e.g., majority) of errors and a second pass, layer, or dimension of erasure ECC (e.g., column codes) to recover a second set (e.g., minority) of information in rows that were not decoded successfully, but erased, in the first decoding pass. The first error correction pass may output corrected information (e.g., with a negligible probability of being wrong) and erased information (e.g., with an above threshold non-negligible probability of being wrong). The corrected information may subsequently be used in the supplemental or second-pass decoding (e.g., column decoding) to decode information (e.g., rows) that failed the first pass decoding and were erased.

In accordance with some embodiments of the present invention, product codes may be efficiently encoded to have a plurality of row (or first dimension) codes including error detection code and/or error correction code for a row (or first dimension) codeword, and have a plurality of column (or second dimension) codes including erasure codes for a column (or second dimension) codeword. For example, a product code may include:

In a first dimension: D1-ECC (to correct errors) and optionally D1-EDC (to detect errors).
In a second dimension: D2-Erasure ECC (to recover erased data).

In some embodiments, the first dimension may comprise rows and the second dimension may comprise columns. In other embodiments, the row and column codes may be switched or transposed so that the first dimension comprises columns and the second dimension comprises rows. Thus, it may be appreciated that any discussion of row and column codes may be interchanged. For example, while some embodiments describe erasure codes to be encoded as column codes, according to some embodiments, erasure codes may instead be encoded as row codes. In some embodiments, additional dimensions may be used to generate a product code with any number of ($1_D$) dimensions. Each dimension may be used to independently encode/decode data.

In accordance with some embodiments of the present invention, the product codes may be efficiently decoded by performing a first decoding pass of the row (or first dimension) and a second decoding pass of the column (or second dimension). The first decoding pass may correct a row (or first dimension) codeword using the row (or first dimension) error correction codes (e.g., D1-ECC) decoder. The decoder may detect if the initially corrected row (or first dimension) codeword contains any remaining errors using the associated error detection codes (e.g., D1-EDC). When no decoding error is detected in a row (or first dimension) codeword, the row (or first dimension) codeword is validated, and no column (or second dimension) decoding may be executed for the data elements in that row (or first dimension) codeword. However, when a decoding failure or error is detected in a row (or first dimension), the row (or first dimension) codeword may be erased and recovered by employing a second error correction pass using erasure correction codes in a column (or second dimension) (e.g., D2-Erasure ECC).

By combining the speed and efficiency of decoding erasure codes (e.g., in a column or second dimension) with the accuracy of decoding ECC (e.g., in a row or first dimension), these product codes provide efficient decoding with good error correction performance. The increase in speed provided by the erasure codes is ideal for systems, for example, with limited computational resources, such as, when information rendering is needed fast or immediately in real-time, such as, as in telecommunications systems (see e.g., FIG. 1A), streaming systems, and fast-storage systems like Flash memories or SSD (solid-state-drives) (see e.g., FIG. 1B).

Reference is made to FIG. 1A, which schematically illustrates a system comprising an ECC encoder and/or decoder operating according to an embodiment of the invention. The system may include one or more source transmitter(s) 110 and one or more receiver(s) 112. Transmitter(s) 110 and receiver(s) 112 may communicate wirelessly or via a wired connection. For wireless communication, transmitter(s) 110 and receiver(s) 112 may include one or more antenna(s) 114 and 116, respectively, for transmitting and/or receiving signals wirelessly over one or more communication channel(s). Receiver(s) 112 may receive one or more noisy error correction codeword(s) transmitted by source transmitter(s) 110 over wired or wireless communication channel(s) and may use a decoder 126 to decode the codeword(s) to reconstruct the transmitted signal.

Transmitter(s) 110 and receiver(s) 112 may include one or more controller(s) or processor(s) 118 and 120, respectively, configured for executing operations or computations disclosed herein and one or more memory unit(s) 122 and 124, respectively, configured for storing data such as inputs or outputs from each of the operations or computations and/or instructions (e.g., software) executable by a processor, for example for carrying out methods as disclosed herein. Processor(s) 120 may decode a product code representation of the input data or codeword(s) sent from transmitter(s) 110 and received by receiver(s) 112.

Processor(s) 118 and 120 may include, for example, a central processing unit (CPU), a digital signal processor (DSP), a microprocessor, a controller, a chip, a microchip, an integrated circuit (IC), or any other suitable multi-purpose or specific processor or controller. Processor(s) 118 and 120 may individually or collectively be configured to carry out embodiments of a method according to the present invention by for example executing software or code. Memory unit(s) 122 and 124 may include, for example, random access memory (RAM), dynamic RAM (DRAM), flash memory, volatile memory, non-volatile memory, cache memory, buffers, registers, short term memory, long term memory, or other suitable memory units or storage units. Processor(s) 120 may be part of a general-purpose processor executing special-purpose decoding software or a special-purpose hardware unit that is a dedicated decoder 126.

Transmitter(s) 110 and receiver(s) 112 may include one or more input/output devices, such as a monitor, screen, speaker or audio player, for displaying, playing or outputting to users results provided by the decoder (e.g., data communicated by transmitter(s) 110 decoded by decoder 126) and an input device (e.g., such as a mouse, keyboard, touchscreen, microphone, or audio recorder) for example to record communication, control the operations of the system and/or provide user input or feedback, such as, selecting one or more encoding or decoding parameters, such as, decoding speed, decoding accuracy, an arrangement of rows and columns in the product code, absolute or relative numbers or lengths of row and/or column codes, numbers of data blocks into which the product code is divided, a threshold amount of time or duration allowable for decoding, a threshold maximum time delay allowable between the time of receiving a signal and the time of decoding the signal, etc.

Figure 1B:
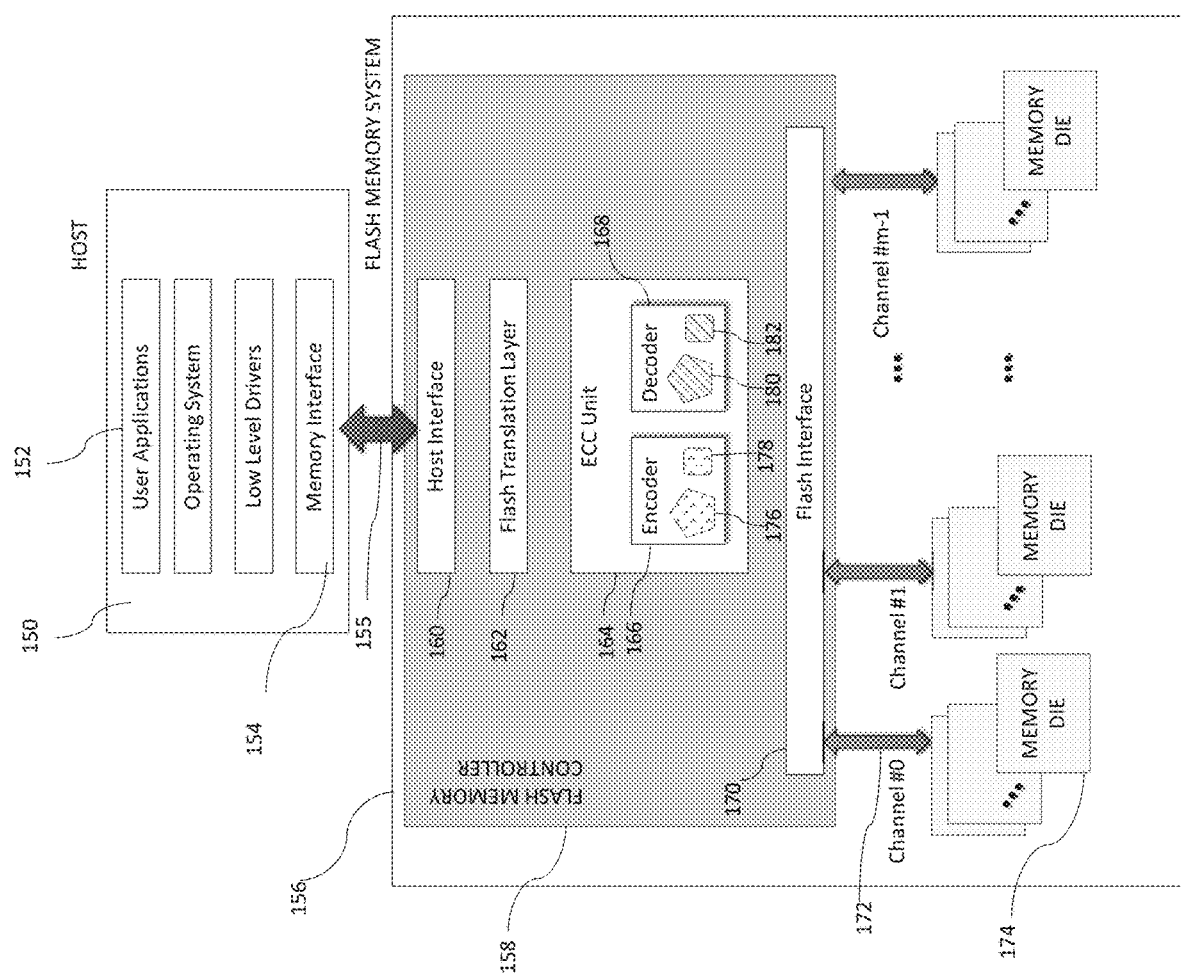
FIG. 1B is a schematic illustration of a memory system comprising an ECC encoder and/or decoder operating according to an embodiment of the invention.

Reference is made to FIG. 1B, which schematically illustrates a memory system comprising an ECC encoder and/or decoder operating according to an embodiment of the invention. In various embodiments, the memory system may be a flash memory system or another memory system, such as, an electromechanical magnetic disc (e.g. hard disk drives), magnetic tapes and volatile electronic memories (e.g. SDRAM and DRAM), comprising an ECC encoder and decoder. While FIG. 1B illustrates a flash memory system, this system and its components may also be used for these other memory systems. Each of one or more components in FIG. 1B may use its own independent processor(s) or any combination of some or all components in FIG. 1B may use the same processor(s).

In FIG. 1B, host 150 may represent a client of a memory system, such as a flash memory system 156. Host 150 may run user applications 152 over an operating system 151. User applications 152 may communicate with memory system 156, for example, using low level drivers 153 that send commands to memory system 156 over a memory interface, such as a flash memory interface 154. Typical commands include commands to store user data in a specified memory location (e.g., identified by an address) and to retrieve user data from a specified memory location of memory system 156. Memory interface 154 may communicate with a memory controller, such as a flash memory controller 158, for example, using a host interface 160 over a memory bus 155.

Memory controller 158 performs the following tasks: (a) to provide the most suitable interface and protocol for both the host 150 and the memory system 156; (b) to efficiently handle data, maximize transfer speed, and maintain data integrity and information retention. In order to carry out such tasks, some embodiments of the invention implement an application specific device, for example, embedding one or more processor(s) (e.g. 176 and 180, usually 8-16 bits), together with dedicated hardware or software to handle timing-critical tasks. Generally speaking, memory controller 158 can be divided into multiple parts (e.g., parts 160, 162, 164 and 170), which are implemented either in hardware or in firmware.

Describing components of memory system 156 from top-to-bottom in FIG. 1B, the first component is host interface 160, which implements industry-standard protocol(s) (e.g., Peripheral Component Interconnect Express (PCIe), Serial Attached SCSI (SAS), Serial AT Attachment (SATA), etc.), thus ensuring both logical and electrical interoperability between memory system 156 (e.g., flash memory cards or Solid State Drives (SSDs)) and hosts 150. Host interface 160 may include a mixture of hardware (e.g., buffers, drivers, etc.) and firmware (e.g., permanent software executed by an embedded processor to perform functions such as command decoding, which may decode a command sequence invoked by host 150 and may handle the data flow to/from memory units or dies, such as a flash memory dies 174. The second component of memory system 156 in FIG. 1B is a (e.g., flash) translation layer 162 that translates between logical memory addresses used by host 150 and physical memory locations of the memory dies 174. Specifically, flash translation layer 162 may perform tasks, such as, wear leveling management, garbage collection and bad block management. Flash translation layer 162 may use general purpose processor(s) or dedicated processing hardware and internal memory to perform its tasks. The next component of memory system 156 in FIG. 1B is ECC unit 164, which includes both an ECC encoder 166 and ECC decoder 168. ECC encoder 166 encodes data by adding redundancy (ECC) to the data before storing the data in one of the memory dies 174 and also reads noisy or distorted versions of the codeword. ECC decoder 168 decodes or eliminates the noise from that codeword, thereby allow retrieval of the original data stored at the host 150. Memory controller 158 may communicate with physical memory dies 174 using an interface layer, such as a flash interface layer 170. Physical memory dies 174 may store data by altering the physical state of memory cells contained inside those dies. Commands and data may be sent between controller 158 and a plurality of memory dies 174 over a physical bus 172, also referred to as a "channel" 172. A single channel may include a plurality of memory dies 174, and interface layer 170 may include a plurality of (m) channels 172.

Interface layer 170 may support access (e.g., storage and/or retrieval) to several channels simultaneously or in parallel. Such architectures of multiple dies 174 and/or multiple channels 172 may increase the read and program throughput, relative to a singular channel or singular die structure, which may also be used. In addition, memory controller 158 may include a plurality of ECC unit 164. Each one of ECC unit 164 may be dedicated for a set of one or more channels 172 (e.g., exclusively encoding/decoding data to/from memory dies 174 on only those dedicated channels 172). In other embodiments, ECC units 164 are not dedicated to any specific channel 172, and may decode/encode any codeword as it becomes available regardless of the memory destination or source of the codeword. In such a case, a controlling unit may route encode/decode requests between ECC units 164 and channels 172.

Memory controller 158 may include one or more controller(s) or processor(s) 176 and 180 for implementation of the ECC encoder 166 and the ECC decoder 168, respectively, configured for executing operations or computations disclosed herein and one or more memory unit(s) 178 and 182, respectively, configured for storing data such as inputs or outputs from each of the operations or computations and/or instructions (e.g., software) executable by a processor, for example for carrying out methods as disclosed herein.

Processor(s) 176 and 180 may include, for example, a central processing unit (CPU), a digital signal processor (DSP), a microprocessor, a controller, a chip, a microchip, an integrated circuit (IC), or any other suitable multi-purpose or specific processor or controller. Processor(s) 176 and 180 may individually or collectively be configured to carry out embodiments of a method according to the present invention by for example executing software or code. Memory unit(s) 178 and 182 may include, for example, random access memory (RAM), dynamic RAM (DRAM), flash memory, volatile memory, non-volatile memory, cache memory, buffers, registers, short term memory, long term memory, or other suitable memory units or storage units.

Reference is made to FIGS. 1C-3, which schematically illustrate product codes configured in various arrangements of row (or first dimension) codes and column (or second dimension) codes, according to various embodiments of the invention. It may be appreciated that rows and columns may be transposed.

Figure 1C:
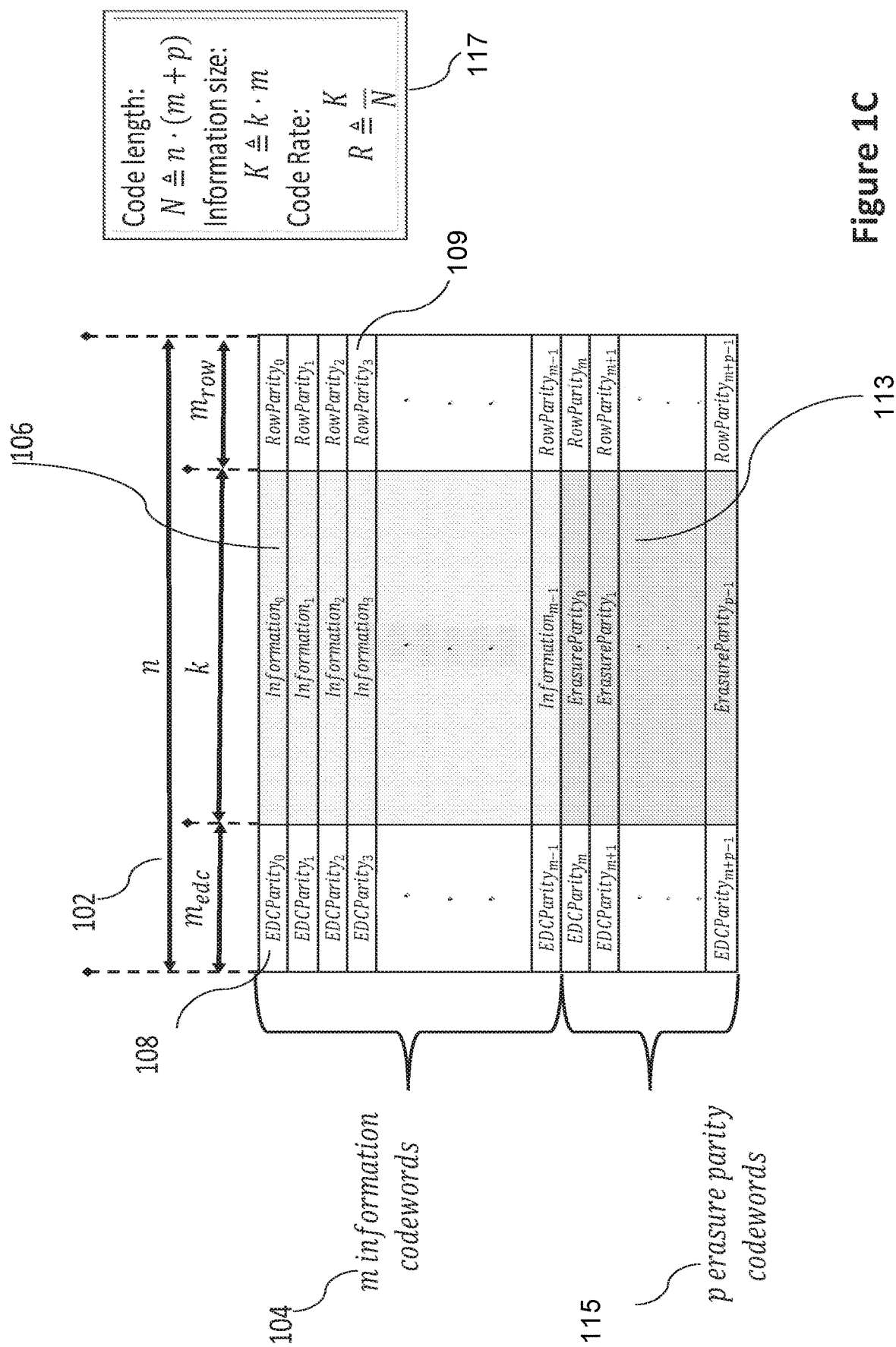
FIG. 1C is a schematic illustration of a product code comprising erasure codes according to some embodiments of the invention.

In FIG. 1C, input user data may be divided into a plurality of segments of rows (e.g., (m) rows of $Information_0$-$Information_{m-1}$ of length (k) 106). The input data may be divided or segmented into (m) portions of size (k). The segmented input data may be encoded by a product code 102. Product code 102 may comprise a plurality of row ECC (e.g., (m) rows of $RowParity_0$-$RowParity_{m-1}$ of length (m) 109) and a plurality of column ECC (e.g., (p) rows of $ErasureParity_0$-$ErasurParity_{p-1}$ of length (k) 113). Each row ECC may include a segment of input data and its associated redundancy (e.g., $EDCParity_i$ and/or $RowParity_i$).

In FIG. 1C, erasure codes 113 may be arranged in a plurality of column codes. Erasure codes 113 may encode the entire set of input data (e.g., information 106), such that, the number of column codes (k) is equal to the length of the input data (k) (e.g., in row codes 106). In other words, erasure codes 113 of a second dimension (e.g., column codes) may span or traverse the entire length of the input data along the first dimension (e.g., row codes 106 of FIG. 1C).

Figure 2:
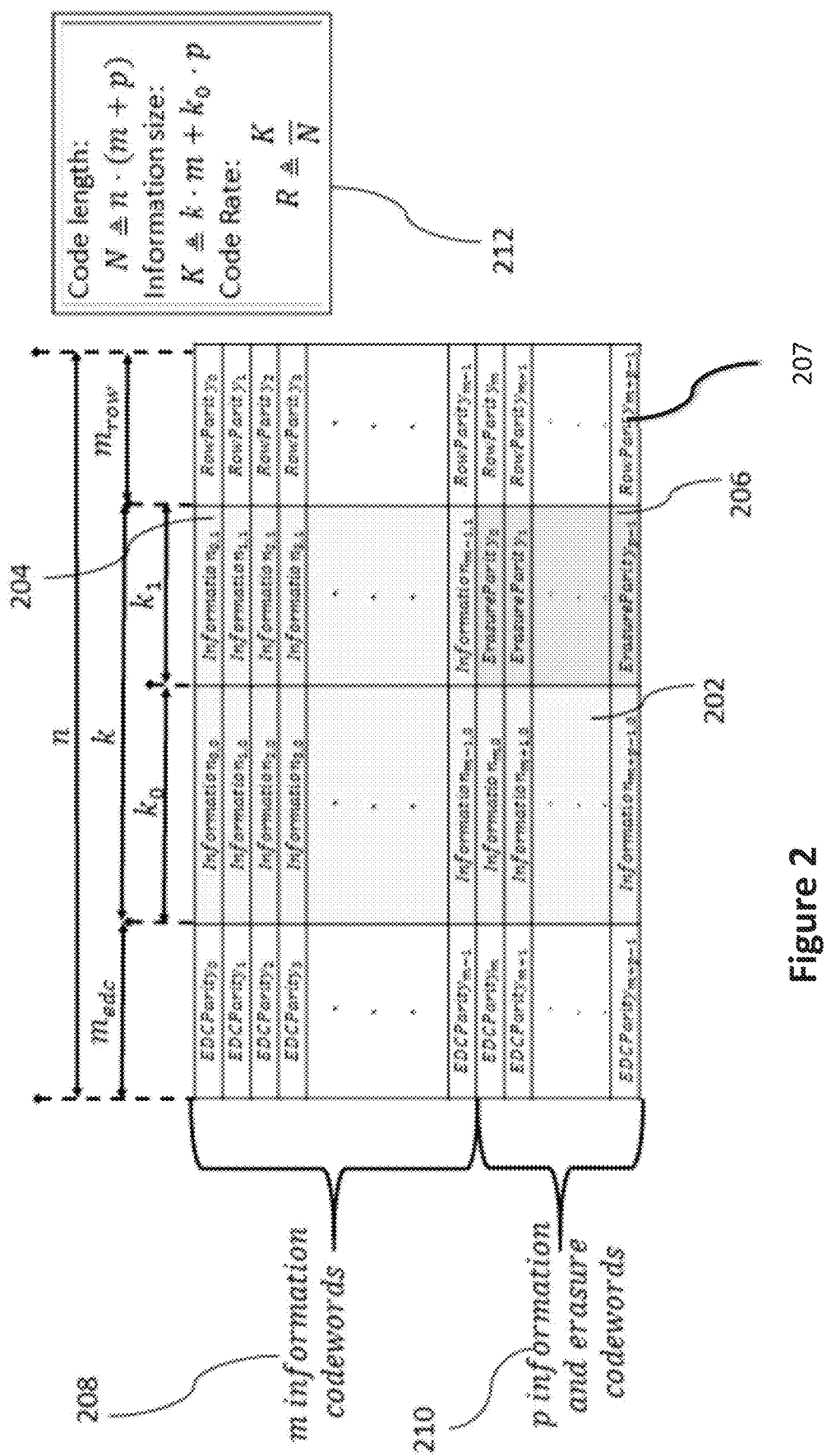
FIG. 2 is a schematic illustration of a product code with a compact arrangement of erasure codes, for example, relative to the arrangement in FIG. 1, according to some embodiments of the invention.

In FIG. 2, the input data may be divided into two or more data blocks, column blocks, or pillars, in a second dimension (e.g., data blocks 202 and 204). In some embodiments, the erasure codes (e.g., column codes 206) may only encode or span a first data block ($k_1$) or subset of the input data (e.g., row codes 204), and not encode and not span another second data block ($k_0$) or subset of the input data (e.g., row codes 202). In other words, the number ($k_1$) of column codewords encoded by erasure codes (e.g., 206) is less than the total number (k) of columns of input data (e.g., 202 and 204). This partial erasure encoding provides a more compact (e.g., smaller erasure ECC redundancy) encoding than in FIG. 1C. In such partial erasure encoding embodiments, the columns of the first data block ($k_1$) may be corrected by the erasure column codes decoders (e.g., 206) as in FIG. 1C. FIG. 2 adds an additional iteration of row decoding to propagate those erasure corrections to the next data block ($k_0$). After column decoding corrects erasures in the first data block 202, the decoder executes a second iteration of row decoding (e.g., over the first and second combined data blocks 202+204) using the rows ECC 207, to correct the rows of the second data block ($k_0$) (e.g., 202). The first iteration of erasure correction (e.g., column decoding) restores the erased information parts $Information_{x,1}$ and their corresponding erasure parities $ErasureParity_j$ in the first data block 204, thereby increasing the probability that the second iteration of error correction (e.g., row decoding) successfully recovers the input data in the second data block 202 (e.g., $Information_{x,0}$). The input data may be successfully corrected if the number of erasures (e.g., failed correction of rows) is within the recovery capability of the erasure codes (e.g., decoders of erasure codes of length or parity (p) may recover up to (p) erasures).

Figure 3:
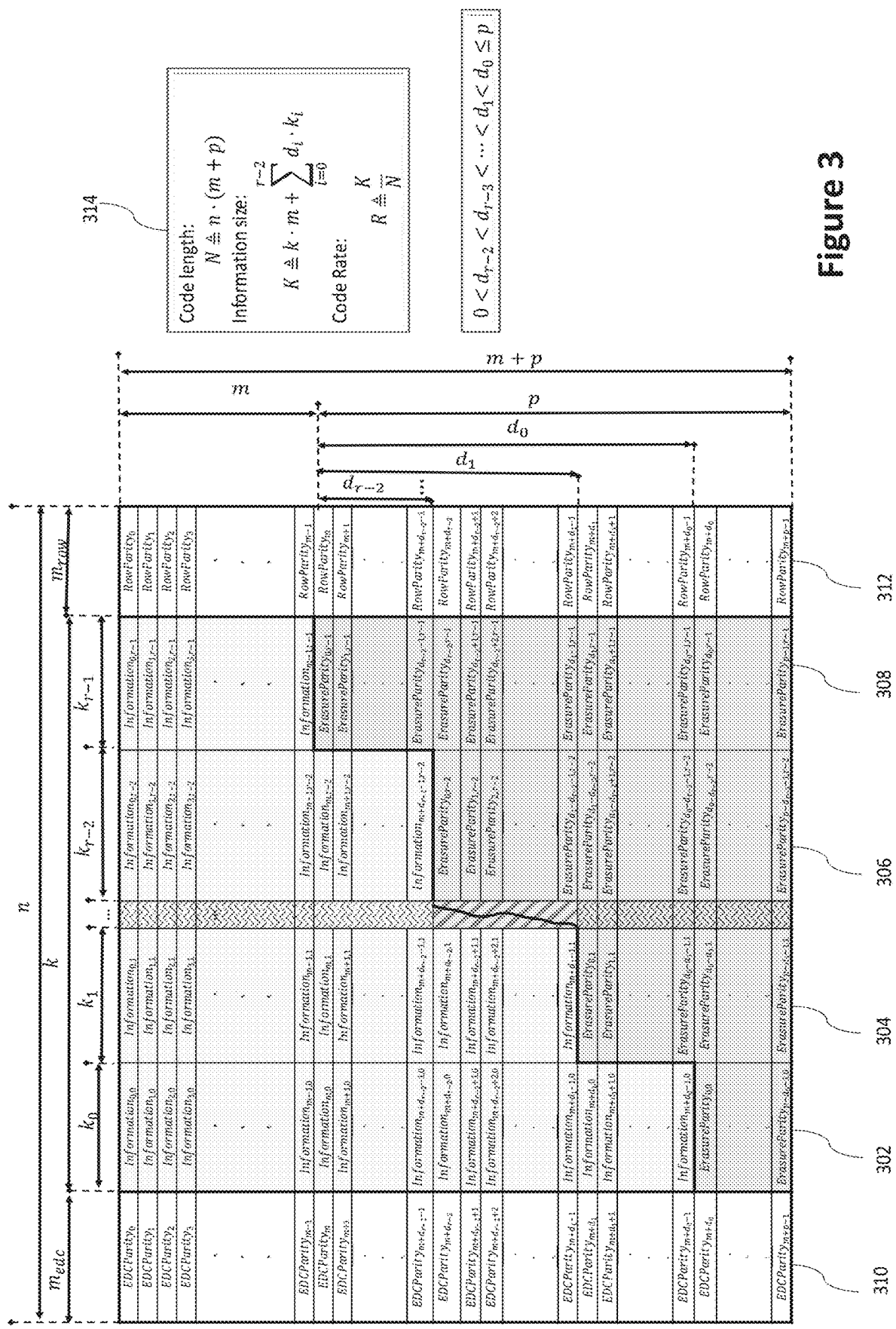
FIG. 3 is a schematic illustration of a product code with a stair-step arrangement of erasure codes, for example, generalizing the compact form of erasure codes in FIG. 2, according to some embodiments of the invention.

In FIG. 3, a product code may have a stair-step arrangement of erasure codes, for example, generalizing the compact form of erasure codes in FIG. 2, according to some embodiments of the invention. In this cascading or stair-step arrangement of erasure codes, the erasure codes may be divided into a plurality of column blocks or pillars (e.g., 302-308). The plurality of column blocks (e.g., 302-308) may have constant length. Each sequential column block 302, . . . , 308 may have an information portion (designated by $Information_{x,y}$, for a fixed y) with a length that incrementally increases (or decreases) in a stair-step pattern and a redundancy portion (designated by $ErasureParity_{x,y}$ for fixed y) with a length that incrementally decreases (or increases), respectively, in an opposite or converse stair-step pattern.

A decoder may execute a plurality of decoding iterations to sequentially decode the plurality of respective data blocks (e.g., the rows $Information_{x,y}$ in 302-308). The decoder may iterate progressing sequentially from the block of column codewords (308) with the (e.g., longest) erasure redundancy (e.g., p) to the block of column codewords (302) with the (e.g., shortest or no) erasure redundancy (p-do). In each iteration, a two-pass decoder may alternate between executing a first-pass row decoding to correct errors in the rows of the data block and executing a second-pass column decoding to restore erased data or rows of the data block (e.g., only for data or rows that are erased in the first pass). To decode the first input codeword block (e.g., the column block with the longest erasure redundancy part) (e.g., 308) in a first iteration, the decoder may execute a first-pass row decoder, decoding rows of the product codeword (e.g., having parity 312). The first pass may continue until $t_1$ (e.g., m) rows are successfully decoded. If errors are detected in a row by the EDC (e.g., having parity 310), the decoder may erase this row. After $t_1$ (e.g. m) rows were successfully decoded, a second-pass column decoder is triggered in attempt to recover the erasures and sections that were not decoded yet using the corresponding (e.g., p) redundancy erasure code parity in the data block (e.g., 308). After recovering the erased information in the first column codeword block (e.g., 308), the decoder may progress to the next ($k_{r-2}$) adjacent second column codeword block (e.g., 306) in a second decoding iteration. To decode the second codeword block (e.g., 306), the decoder may execute a first-pass row decoder, seeking to decode successfully $t_2$ (e.g., $m+d_{r-2}$) rows of the product codeword using the row ECC (e.g., with parity 312) (e.g., including the ($t_1$) rows that were successfully decoded in the previous iteration). Following this pattern, a second-pass column decoder may attempt to recover the missing parts of second data block (e.g., 306) using the additional redundant set of (e.g., $p-d_{r-2}$) erasure column codes (e.g., 306). After the erasures are corrected in the second iteration by column decoding the second data block (e.g., of $k_{r-2}$ columns), the decoder may then revert to row decode any failed rows of the previous first iteration using the corrected rows and ECC (e.g., with parity 312). Erasures recovered in one iteration (e.g., by column decoding the first $k_{r-1}$ columns in the column block 308) may propagate to correct errors in the next iteration (e.g., when row decoding the $t_2-t_1$ rows), thus propagating corrections from one data block to the next. Accordingly, each subsequently decoded data block (e.g., 308, 306, . . . , 304, 302) includes an incrementally increasing number of successful decoded rows $t_1$, $t_2$, $t_3$, . . . , $t_{r-1}$ (e.g., m, $m+d_{r-2}$, $m+d_{r-1}$, . . . , $m+d_0$, respectively) forming the stair-step pattern of FIG. 3.

In accordance with some embodiments of the present invention, multiple rows may be decoded simultaneously (in parallel) or sequentially (in series or in a pipeline). In accordance to some embodiments of the present invention, multiple columns may be decoded simultaneously (in parallel) or sequentially (in series or in a pipeline). In accordance with some embodiments of the present invention, rows and columns of a product code may be encoded simultaneously (in parallel) or sequentially (in series or in a pipeline). In some embodiments, encoding or decoding may be executed in sequence or in parallel depending on speed or hardware requirements. For example, encoding or decoding in parallel provides faster results than encoding or decoding in sequence. However, encoding or decoding in parallel uses more complex circuitry (e.g., duplicating some logical circuitry) than encoding or decoding in sequence. In various embodiment, an encoder/decoder may encode/decode all (or a subset of) rows followed by all (or a subset of) columns, or may alternate between encoding/decoding rows and columns or row blocks and column blocks. In some embodiments, implementing the above parallelization may depend on whether the average decoding time or latency is acceptable for the rendering needs of each system. For example, if real-time decoding is needed, parallelization may only be used if a decoding speed greater than provided by sequential decoding is needed to render the data in real-time. In some embodiments, parallelization may be selectively or dynamically implemented or adjusted in real-time to meet changing data error rates or rendering speeds.

In some embodiments, determining the length or parity (p) of the erasure codes may depend on the average error rates of the data, the length, type and/or error correction rate of the row (or first dimension) ECC, and/or system error requirements. The length or parity (p) of the erasure codes in each column may be equal to the number of erased rows the erasure codes may recover. This length of the erasure codes (p) may be equal to a predetermined value, may be set to meet system requirements for maximal errors, or may be adjusted dynamically based on rates of system errors. In some embodiments, the length or parity (p) of the erasure codes may be tuned, for example, increased proportionally to the level of noise over the channel, or inversely proportionally to the system's threshold error acceptability. In one example, if the probability of having two erasures is on the order of $10^{-6}$, and the system has an error acceptability threshold of $10^{-4}$, then only a single erasure parity may be used because the probability of two erasures is very unlikely (e.g., $10^{-6}$, which is less than the system's threshold error acceptability of $10^{-4}$). In some embodiments, the size (e.g., height of the stairs) of erasure parity may be adjusted on-the-fly, e.g., based on the real-time error rates. For example, if the level of noise over a channel is consistently measured to be below a threshold, the receiver may signal the transmitter to reduce the erasure parity segment (e.g., reduce p and/or increase $d_i$), whereas if the level of noise over a channel is consistently measured to be above a threshold, the receiver may signal the transmitter to increase the erasure protection, by increasing the number of parity symbols per columns (e.g. increase p and/or decrease $d_i$). In some embodiments, the receiver may send a pre-emptive handshake signal to the transmitter, requesting a test codeword (e.g., also referred to as a training sequence or pilots) to determine the real-time level of noise over the channel, and send a tuned parity order to the transmitter requesting that the transmitted maintains a minimum parity configuration to ensure the system's threshold error acceptability. Erasure parity may be tuned periodically, upon detecting or receiving an indication of a change in signal or channel quality, and/or upon a first loss of data.

The following notations and conventions are used herein for example only (other notations or representations may also be used). For a natural number l, the term $[l]_-$ may denote the set of size l, $\{0, 1, 2, \ldots l-1\}$). Vectors may be denoted by bold letters and random variables may be denoted by capital letters (e.g., random vectors may be denoted by bold upper-case letters). For $i \leq j$, $u_i^j = [u_i, u_{i+1}, \ldots, u_j]$ may denote a sub-vector of u of length $j-i+1$ (e.g., if $i > j$, then $u_i^j = [\,]$, the empty vector, and its length is 0). Vectors described herein are assumed to be row-vectors, although vectors may also represent column vectors, sequences, or other data structures. Column vectors may be generated from row vectors u by the transpose operation, $u^T$, or vice versa.

Matrices may be denoted by capital letters. A matrix M with $m_r$ rows and $m_c$ columns over a set F may be denoted as $M \in F^{m_r \times m_c}$. The element located at the $i^{th}$ row and the $j^{th}$ column of matrix M may be denoted as $M_{i,j} \in F$. Let $M^{(0)} \in F^{m_r \times m_c}$ and $M^{(1)} \in F^{m_r \times \tilde{m}_c}$, then a matrix $M \in F^{m_r \times (m_c + \tilde{m}_c)}$ that is a concatenation of $M^{(0)}$ and $M^{(1)}$ column-by-column may be denoted as $M = [M^{(0)}, M^{(1)}]$, for example, defined as:

$$M_{i,j} = \begin{cases} M_{i,j}^{(0)} & 0 \leq j \leq m_c - 1 \\ M_{i,j-m_c}^{(1)} & m_c \leq j \leq \tilde{m}_c + m_c - 1 \end{cases}, 0 \leq i \leq m_r - 1.$$

Let $M^{(0)} \in F^{m_r \times m_c}$ and $M^{(1)} \in F^{\tilde{m}_r \times m_c}$. A matrix $M \in F^{(m_r + \tilde{m}_r) \times m_c}$ that is a concatenation of $M^{(0)}$ and $M^{(1)}$ row-by-row may be denoted as $M = [M^{(0)}; M^{(1)}]$, for example, defined as:

$$M_{i,j} = \begin{cases} M_{i,j}^{(0)} & 0 \leq i \leq m_r - 1 \\ M_{i-m_r,j}^{(1)} & m_r \leq i \leq \tilde{m}_r + m_r - 1 \end{cases}, 0 \leq j \leq m_c - 1.$$

A vector u of length $\gamma=\gamma_0 \cdot \gamma_1$ may be reshaped into a matrix $\Gamma$ of $\gamma_0$ rows and $\gamma_1$ columns if $\Gamma_{i,j}=u_{i+j\cdot\gamma_0}$ for $i\in[\gamma_0]_-$, $j\in[\gamma_1]_-$, e.g., the values of the vector appear in M column by column. The first column of M may include the first $\gamma_0$ terms, the next column may include the next $\gamma_0$ terms, and so on.

Given a set of possible signal values F, an error correction code ECC (denoted as C) of length n symbols may be a subset of an n-dimensional space $F^n$. The rate of C may be defined, for example, as $$R = \frac{\log_2|C|}{n \cdot \log_2|F|}$$

based on the size or magnitude of the code |C|, the size of the field |F| and the length of the code n. The rate may be the proportion of user information symbols that is conveyed when sending a codeword with respect to the total codeword length (e.g., a higher rate indicates a more efficient representation of the signal). For example, as the codeword length n increases, the rate R decreases and the speed decreases for communicating or transferring information. If the set of possible signal values F is a field and C is linear space in $F^n$, C may be a linear code over F. Such a code C may be defined, in one example, by a generating matrix B, e.g., having $k=R\cdot n$ rows and n columns, e.g., such that $C=\{v \cdot B | v \in F^k\}$. The parameter k may denote the code dimension, e.g., such that $|C|=|F|^k$ (the code dimension k is equal to the base |F| logarithm of the size of the code).

For a linear code C of dimension k with generating matrix B, another code C' may be generated as $C'=\{v \cdot B | v \in F^k, v_i=f_0\}$. In other words, C' may be a sub-code of C in which $v_i=f_0$. In this case, the value $v_i$ may be referred to as "frozen" to the value $f_0$. This freezing operation is also generally referred to as "code expurgation".

A dual space of a linear code C may be denoted as $C^\perp$ and may be defined as a plurality or all of the vectors in $F^n$ that are orthogonal to all the codewords in C. Thus, the dual space $C^\perp$ is orthogonal to its code space C such that any codeword $c^\perp \in C^\perp$ is orthogonal to any codeword $c \in C$, e.g., $c^\perp \cdot c^T=0$. Codewords $c^\perp$ of the dual space $C^\perp$ may be generated by a dual space generating matrix H (e.g., a parity check matrix of C) that may have, for example, n columns and n-k rows, such that $c \in C$ if and only if $c \cdot H^T=0$. A syndrome s of a length n vector v may be defined, for example, as $s=v \ H^T$. Thus, the syndrome of codewords $c \in C$ is, for example, zero. A syndrome may measure the result of applying the parity check equations (e.g., columns of H) to the values of a codeword v. When all the parity check equations are satisfied (e.g., $v \cdot H^T$ is equal to the zero vector), then codeword v is a codeword in C.

An encoder ENC(•) may be referred to as "systematic" if there exists a sequence of indices $i_j$ ($j\in[k]_-$) such that for each codeword $c_0^{n-1}$ its corresponding information word $u_0^{k-1}$ fulfills $u_j=c_{i_j} \forall j\in[k]_-$. In other words, the information words appear as sub-vectors of the codeword. An encoder may be referred to as "non-systematic" if there does not exist such a sequence. An encoder may be referred to as "semi-systematic" if only a sub-vector of u appears on its corresponding codeword. In other words, there exists l<k, such that $u_j=c_{i_j} \forall j\in[l]_-$, $\forall u_0^{k-1}$ and there does not exist such a sequence of indices $i_j$ for $1 \le j \le k-1$. A de-encoder $ENC^{-1}(\bullet)$ may be defined that maps each codeword c to its corresponding information word u. The decoder may receive a distorted version of the codeword and estimates the codeword that was sent and/or its information part.

Consider a channel carrying signals $x \to y$ in which a signal $x \in \mathcal{X}$ is transmitted using a transmitter over the channel and a noisy version of the signal $y \in \mathcal{Y}$ is received at a receiver. The channel may be "memoryless," meaning that the channel noise at one time for one transmission $x_i \to y_i$ is independent of the channel noise at another time for another transmission $x_j \to y_j$.

A maximum likelihood (ML) codeword decoder may determine for each received channel observation vector y, the most probable transmitted codeword x, for example, by maximizing the following likelihood:

$$Pr(Y_0^{n-1}=y_0^{n-1}|X_0^{n-1}=x_0^{n-1})=\Pi_{i=0}^{n-1} Pr(Y_i=y_i|X_i=x_i).$$

This likelihood defines the probability or likelihood of receiving a channel observation vector y if a codeword x is sent over the channel. The maximum likelihood codeword decoder may be defined, for example, as:

$$\hat{x} = \underset{x_0^{n-1}\in C}{\mathrm{argmax}} Pr(Y_0^{n-1}=y_0^{n-1}|X_0^{n-1}=x_0^{n-1})$$

to detect the transmitted codeword $\hat{x}=x_0^{n-1}\in C$ that maximizes this probability. If each codeword in an ECC C is sent over the channel with same probability (e.g., the system has no preference or bias for certain codewords over others, such as preferring 0's over 1's in a binary system), then this maximum likelihood criterion corresponds to a minimum block error probability (BLER) $Pr(\hat{X} \ne X)$ defining a minimum probability of error that the estimated codeword $\hat{x}$ is incorrect. If codewords in an ECC C are transmitted with bias, then the maximum likelihood criterion above may be replaced with argmax of $Pr(Y_0^{n-1}=y_0^{n-1}|X_0^{n-1}=x_0^{n-1}) Pr(X_0^{n-1}=x_0^{n-1})$ to take the preference into account. In such a case, the criterion may be referred to as the maximum posteriori probability (MAP) criterion.

The maximum likelihood (ML) criterion may minimize the output block error probability. However, in many cases, implementing such maximum likelihood (ML) criterion is prohibitive because of the high complexity of the ML computations required to examine all possible candidate codewords in the codebook. In some embodiments, an approximation of ML may be used to reduce decoding complexity in a first pass or dimension of a product code. To compensate for errors caused by the approximation, some embodiments of the present invention may provide erasure correction in a second or supplemental pass or dimension of a product code. Such methods and apparatuses may provide fast and efficient encoding and decoding while still achieving effective error correction performance.

Reference is again made to FIG. 1C, which schematically illustrates a product code according to some embodiments of the invention. Let C be a code over a set of possible signal values F of length N symbols. FIG. 1C illustrates a product code having n columns 102 and m+p rows. The input data being encoded are divided into the first m rows 104. The size of the input data is k·m symbols and the input data may be equally partitioned into m subsets or rows denoted as $Information_0$, $Information_1$, ..., $Information_{m-1}$ 106. Each subset or row of input data 106 may be systematically encoded by an error detection code (e.g., a cyclic redundancy code, CRC) with parities $EDCParity_0$, $EDCParity_1$, ..., $EDCParity_{m-1}$ 108. Each row of error detection code 108 may have a parity size of $m_{edc}$ symbols. Each row i=0, 1, 2, ..., m-1, of $EDCParity_i$ and/or $Information_i$ may be encoded by an error correction code with parity 109 denoted RowParity$_i$. Each row of error correction code 109 may have a parity size of m$_{row}$ symbols. In total, the row code comprising input data, error detection code and error correction code, has length n symbols and information length k+m$_{edc}$ symbols. Information length may measure the length of the codeword (e.g., in symbols/bits), for example, excluding redundant parity bits. For the row ECC code, the information chunk (Information$_0$) and optionally its corresponding EDC parity (EDCParity$_0$) may serve as the "information part" of the row ECC, e.g., because the information part is encoded to generate row ECC parity (RowParity$_0$). In some embodiments, the length of the code generated by concatenating EDC to row ECC may have a parity size that is m$_{edc}$+m$_{row}$, leaving the information length of the information part to be k.

As shown in FIG. 1C, the first m codewords 104 are organized in a matrix of m rows and k columns. The k columns of the matrix represent the rows of input data (information$_i$) 106. Those k columns may be divided into subsets or row segments of l elements, l≥1 such that l divides k (e.g., the first l symbols of each row are the first row segment, the next l symbols generate the second row segment, and so on). Each row segment may be considered a "mega symbol" containing a plurality of (l) individual symbols. In total, there are $$\frac{k}{\ell}$$

mega symbols per row of input data (information$_i$) 106. A column in the matrix consisting of those mega-symbols may be referred to as a "mega-column" or simply a column.

Each one of those columns may be encoded by a systematic erasure correcting code 109, for example, having parity size of p symbols. The erasure correction code may therefore have code length m+p mega-symbols and m information mega-symbols. The erasure correction codes may generate a p×k matrix of erasure correction code parity 113. The erasure correction codes parity or redundancy 113 may be organized into rows such that mega symbol i of all the instances of the columns erasure detection code may be located in the ith erasure correction code parity 113, ErasureParity$_i$. In total, p rows 115 of erasure correction code parity 113 may be generated. Each such row of erasure correction code parity 113, ErasureParity$_i$, may be encoded by a systematic error detection code (with parity EDCParity$_{m+i}$). Both the erasure correction code parity 113, ErasureParity$_i$, and the error detection code parity 108, EDCParity$_{m+i}$, may then be encoded by the row error correction code 109, generating RowParity$_{m+i}$.

The (m+p)×k matrix with rows of Information$_i$ and ErasureParity$_j$ where i=0, 1, 2, ..., m-1 and j=0, 1, 2, ..., p-1 may be referred to as the "main information matrix" denoted by M.

Example parameters of the product code of FIG. 1C are summarized in box 117, including, for example, the length of the product code (denoted as N), its input information size (denoted as K) and the product code rate (denoted as R).

Reference is made again to FIG. 2, which schematically illustrates a product code, for example, dividing the input data of FIG. 1C into a plurality of data blocks, according to some embodiments of the invention. The product code of FIG. 2 may be a generalization of the product code of FIG. 1C (e.g., the product code of FIG. 1C is equivalent to the product code of FIG. 2 when k$_0$=0).

In this structure, an input data vector of size K=k·m+k$_0$·p symbols may be encoded as a product codeword with the following format:

A first input data block 202 of k$_0$·(m+p) symbols may be organized in a matrix of k$_0$ columns and (m+p) rows. Row i of this matrix may be denoted as Information$_{i,0}$ where 0≤i≤m+p-1.

A second input data block 204 of the k$_1$·m symbols may be organized in a matrix of k$_1$ columns and m rows. Row i of this matrix is denoted Information$_{i,1}$ where 0≤i≤m-1.

The k$_1$ columns of the second input data block 204 may be divided into row segments or sub-rows of l elements, l≥1 such that e divides k$_1$ (e.g., the first l symbols of each row are the first row segment, the next l symbols generate the second row segment, and so on). Each row segment may be considered a "mega symbol". In total, there may be $$\frac{k_1}{\ell}$$

mega symbols per row segment, information$_{i,1}$. A column in the matrix including those mega-symbols is referred to as a "mega-column" or simply a column. Each one of those columns may be encoded by a systematic erasure correcting code, for example, having parity size of p symbols. The erasure correcting code parity 206 may be organized in a matrix with, for example, p rows and k$_1$ columns, such that row i of this matrix (denoted as ErasureParity$_i$) contains the i$^{th}$ parity mega-symbols from each one of the k$_1$/l erasure parities. The (m+p)×k matrix that contains the Information$_{i,j}$ and ErasureParity$_t$ row segments may be referred to as the "main information matrix" and denoted by M. An encoder may encode the product code or matrix of FIG. 2 as follows:

To encode the top m rows, for each i=0, 1, ..., m-1, the encoder may encode Information$_{i,0}$ and Information$_{i,1}$ by a systematic error detection code with parity size m$_{edc}$ symbol denoted as EDCParity$_i$. Next, the encoder may encode Information$_{i,0}$, Information$_{i,1}$ and EDCParity$_i$ by an error correction code (not necessarily systematic) with a redundancy of m$_{row}$ symbols. In the example of FIG. 2 the row code is systematic (although the row code may be non-systematic) with parity size of m$_{row}$ symbols denoted as RowParity$_i$. These steps generate m codewords 208 such that each row codeword is generated using only the user information in its same row.

To encode the bottom p rows, for each i=0, 1, ..., p-1, the encoder may encode Information$_{m+i,0}$ and ErasureParity$_i$ by the aforementioned systematic error detection code with parity size m$_{edc}$ symbol denoted as EDCParity$_{m+i}$. Next, the encoder may encode Information$_{m+i,0}$ and ErasureParity$_i$. These steps generate p codewords 210, such that each row codeword is generated using only the user information in its same row, and the erasure code parities corresponding to all the rows of matrix 204.

Example parameters of the product code of FIG. 2 are summarized in box 212, including, for example, the length of the product code (denoted as N), its input information size (denoted as K) and the product code rate (denoted as R).

Reference is again made to FIG. 3, which schematically illustrates a product code with a stair-step arrangement of erasure codes, according to some embodiments of the current invention. The structure of FIG. 3 may be understood as a generalization of FIG. 2. In the structure of FIG. 3, a user information vector of length $K \triangleq k \cdot m + \sum_{i=0}^{r-2} d_i \cdot k_i$ (where $0 < d_{r-2} < d_{r-3} < \ldots < d_1 < d_0 \leq p$) may be organized in the following format:

$k_0 \cdot (m+d_0)$ symbols may be organized in a matrix of $k_0$ columns and $(m+d_0)$ rows. Row i of this matrix is denoted Information$_{i,0}$ where $0 \leq i \leq m+d_0-1$. If $d_0 < p$, each row of the matrix may be divided into mega-symbols of $l_0$ symbols ($k_0$ is divisible by $l_0$) and each mega-column may be encoded by a systematic erasure correction code with parity size of $p-d_0$ mega-symbols. These parities of the instances of the column code may be organized in p-do rows such that row i (denoted ErasureParity$_{i,0}$) contains the $i^{th}$ parity mega-symbol from each one of the column code instances. If $d_0 = p$ no erasure correction code may be applied on the columns of this matrix. Matrix 302 contains Information$_{i,0}$ chunks as its first $m+d_0$ rows, followed by the $p-d_0$ ErasureParity$_{i,0}$ symbols.

For j=1, 2, ..., r−2: $k_j \cdot (m+d_j)$ symbols may be organized in a matrix of $k_j$ columns and $(m+d_j)$ rows. Row i of this matrix is denoted as Information$_{i,j}$ where $0 \leq i \leq m+d_1-1$. Each row of the matrix may be divided into mega symbols of $l_j$ symbols ($k_j$ is divisible by $l_j$). Each mega-column of the matrix may be encoded by a systematic erasure correction code with parity size of $p-d_j$ symbols. These parities of the instances of the column code may be organized in $p-d_j$ rows such that row i (denoted ErasureParity$_{i,j}$) contains the $i^{th}$ parity mega-symbol from each one of the column code instances. Matrices 304 and 306, for j=1 and j=r−2, respectively, contain the Information$_{i,j}$ chunks in its first $m+d_j$ rows, followed by ErasureParity$_{i,j}$ symbols in its next $p-d_j$ rows.

$k_{r-1} \cdot (m+d_{r-1})$ symbols are organized in a matrix of $k_{r-1}$ columns and $(m+p)$ rows. Row i of this matrix may be denoted Information$_{i,r-1}$ where $0 \leq i \leq m+p-1$. Each row of the matrix may be divided into mega-symbols, each one of $l_{r-1}$ symbols ($k_{r-1}$ is divisible by $l_{r-1}$). Each mega-column of the matrix may be encoded by a systematic erasure correction code with parity size of p mega-symbols. These parities of the instances of the column code are organized in p rows such that row i (denoted ErasureParity$_{i,r-1}$) contains the $i^{th}$ parity symbol from each one of the column code instances. Matrix 312 contains the Information$_{i,r-1}$ chunks in its first $m+d_{r-1}$ rows, followed by the ErasureParity$_{i,j}$ symbols in its next p rows.

An $(m+p) \times k$ matrix that is a concatenation (column by column) of the aforementioned matrices may be the main information matrix denoted by M. The rows of M may be encoded, for example, as follows:

To encode the top m rows, for each i=0, 1, ..., m−1 Information$_{i,0}$, Information$_{i,1}$, ..., Information$_{i,r-1}$, may be concatenated into a single vector and encoded by a systematic error detection code with parity size $m_{edc}$ symbols denoted as EDCParity$_i$. Next, the encoder may encode Information$_{i,0}$, Information$_{i,1}$, ..., Information$_{i,r-1}$ and EDCParity$_i$ by an error correction code (not necessarily systematic) with a redundancy of $m_{row}$ symbols. In the example of FIG. 3, the row code is systematic (although the row code may be non-systematic) with parity size $m_{row}$ symbols denoted as RowParity$_i$.

For j=1, 2, ..., r−2 let $\Delta_j = d_{r-j-1} - d_{r-j}$ and i=0, 1, ..., $\Delta_j - 1$ ($d_{r-1} \triangleq 0$) Information$_{m+d_{r-j}+i,0}$, Information$_{m+d_{r-j}+i,1}$, ..., Information$_{m+d_{r-j}+i,r-1}$,j and ErasureParity$_{i,r-j}$, ErasureParity$_{i+d_{r-j}-d_{r-j+1},r-j+1}$, ErasureParity$_{i+d_{r-j}-d_{r-j},2,r-j+2}$, ... ErasureParity$_{i+d_{r-j},r-1}$ may be concatenated into a single vector (e.g., referred to as the error detection code information word). This vector may be encoded by the aforementioned systematic error detection code, for example, having a parity of size $m_{edc}$ symbols, denoted as EDCParity$_{m+d_{r-j}+i}$. The error detection code information word and parity are then encoded by the aforementioned row error correction code with parity denoted by RowParity$_{m+d_{r-j}+i}$.

For i=0, 1, ..., $p-d_0-1$, ErasureParity$_{i,0}$, ErasureParity$_{i+d_0-d_0,1}$, ErasureParity$_{i+d_0-d_2,2}$, ... ErasureParity$_{i+d_0,r-1}$ may be concatenated into a single vector (e.g., referred to as the error detection code information word). This vector may be encoded by the aforementioned systematic error detection code, for example, having parity of size $m_{edc}$ symbols, denoted as EDCParity$_{m+d_0+i}$. The error detection code information word and parity are then encoded by the aforementioned row error correction code with parity denoted as RowParity$_{m+d_0+i}$.

Example parameters of the product code of FIG. 3 are summarized in box 314, including, for example, the length of the product code (denoted as N), its input information size (denoted as K) and the product code rate (denoted as R).

The structure of the product code in FIG. 3 is a generalization of the structures proposed in FIG. 1C and FIG. 2. Specifically, FIG. 1C is the case of r=1 and $k_0$=k and FIG. 2 is the case of r=2 and $d_0$=p. Furthermore, the $(p+m) \times k$ matrix containing the Information$_{i,j}$ and ErasureParity$_{i,j}$ chunks may be the main information matrix AM of the structure.

Figure 4:
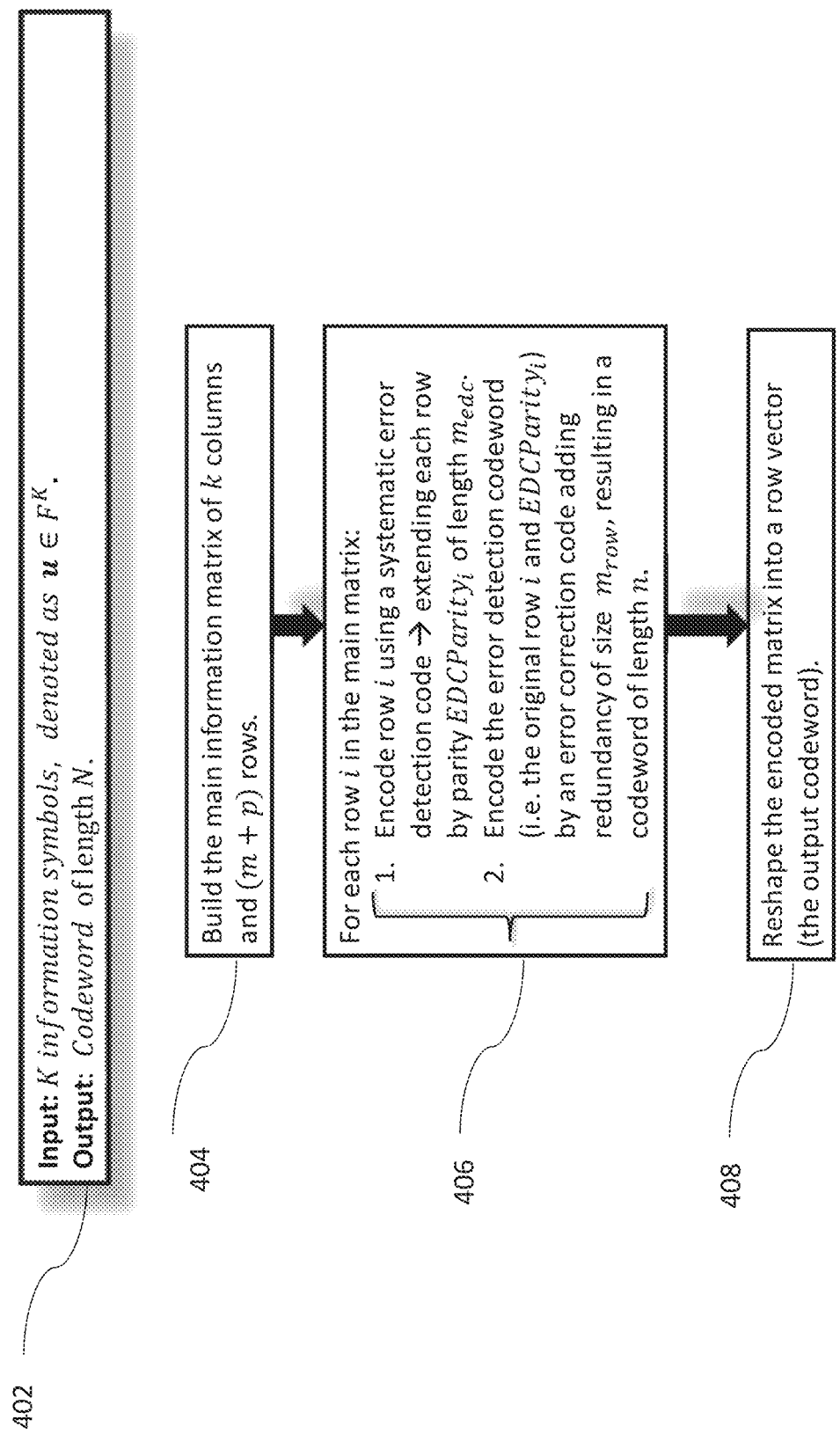
FIG. 4 and FIG. 5 are flowcharts of processes for encoding a product code (e.g., arranged as in FIG. 3), according to some embodiments of the invention.

Reference is made to FIG. 4, which is a flowchart of a process for encoding a product code, according to some embodiments of the invention. In FIG. 4, a product code of FIG. 3 is encoded, which being the generalized form, also applies to encoding the product codes of FIGS. 1 and 2. Operations described in reference to the flowcharts herein may be executed using components or devices of FIG. 1A and/or FIG. 1B, for example, one or more transmitter processor(s) 110 and/or encoder(s) of FIG. 1A and/or one or more ECC encoder 166 processor(s) 176 of FIG. 1B or other devices. Other operations or orders of operations may be used than shown on the flowcharts.

The input (e.g., K information symbols) and output (e.g., a product codeword of length N) of the process of FIG. 4 is defined in 402.

In operation 404, one or more processor(s) may encode the input information to build the main information matrix having k columns and m+p rows.

In operation 406, one or more processor(s) may encode each row of the matrix by an error detection code (step 1) and later a row error correction code (step 2).

In operation 408, one or more processor(s) may generate a single row codeword by concatenating the rows of the matrix. The operations may be performed sequentially, so that each step can start only after the previous step has ended, or in parallel. The structure of the code, however, supports pipelined operation of the steps if such a mechanism is advantageous.

Figure 5:
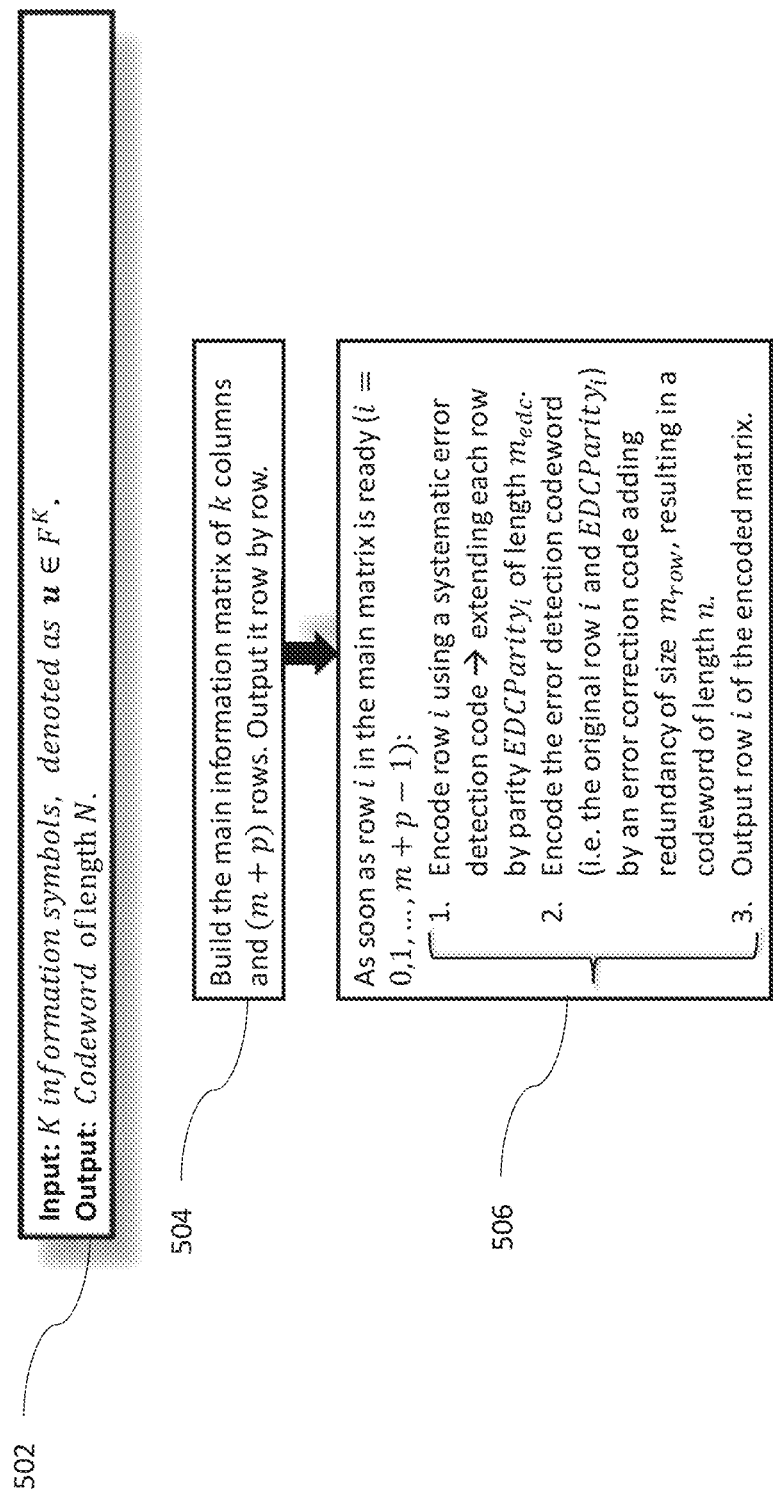

Reference is made to FIG. 5, which is a flowchart of a process for encoding a product code using parallel operations, according to some embodiments of the invention. The operations of FIG. 5 may be executed sequentially or in parallel.

The input (e.g., K information symbols) and output (e.g., a product codeword of length N) of the process of FIG. 5 is defined in 502.

In operation 504, one or more processor(s) may encode the input information, row-by-row, to build the main information matrix having k columns and m+p rows. The process may input each row into operation 506 as soon as it is generated.

In operation 506, as soon as each row i is generated, one or more processor(s) may encode the row of the matrix by an error detection code (step 1) and later a row error correction code (step 2). The process may input each row into operation 506 as soon as it is encoded.

In operation 506, one or more processor(s) may generate a single row codeword by concatenating the rows of the matrix.

Figure 6:
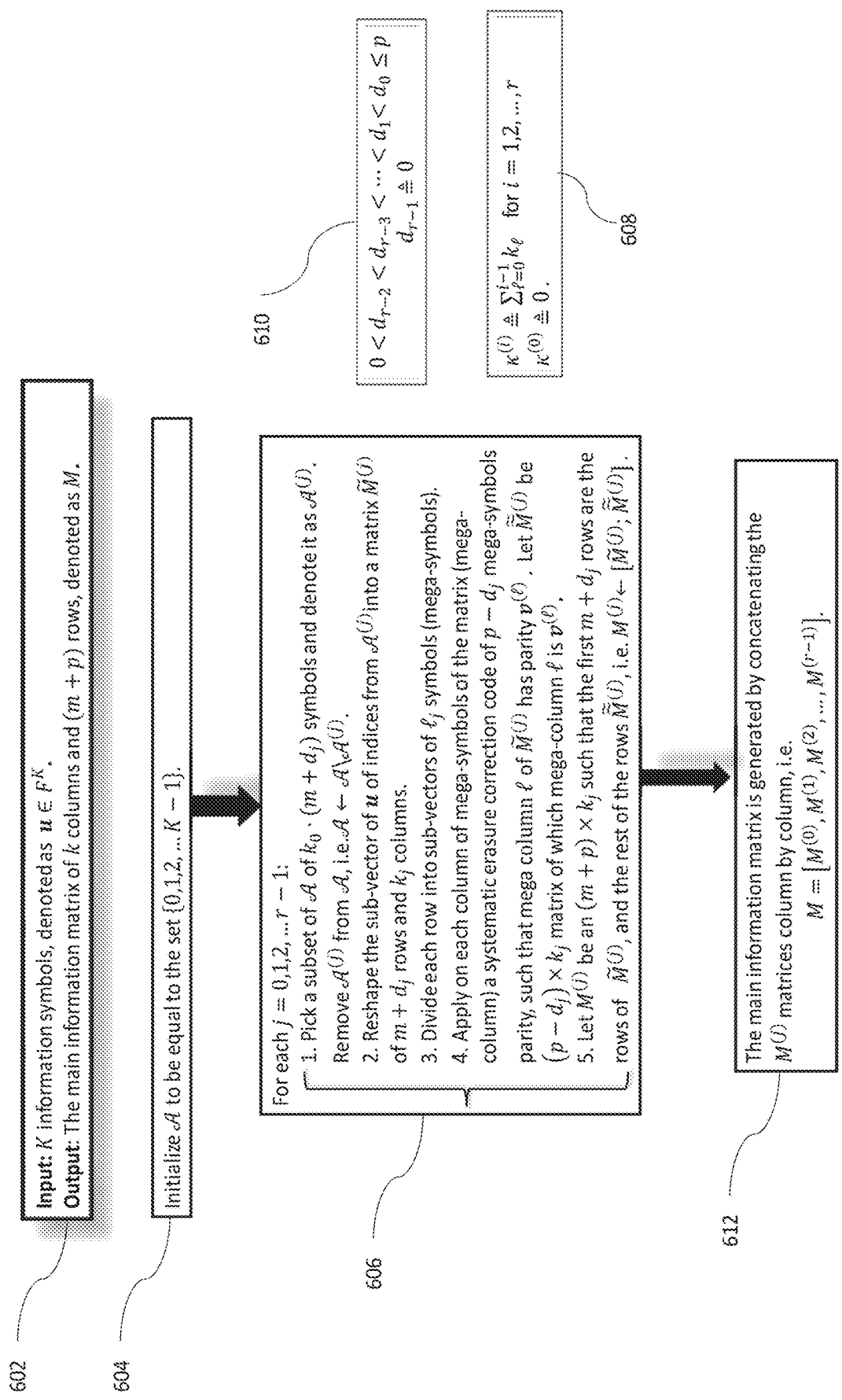

Reference is made to FIG. 6, which is a flowchart of a process for generating an information matrix M, for example, used in operation 404 of FIG. 4, according to some embodiments of the invention.

The input (e.g., K information symbols) and output (e.g., an information matrix M) of the process of FIG. 6 is defined in 602.

In operation 604, one or more processor(s) may initialize a set $\mathcal{A}$ of integer numbers $0, 1, \ldots, K-1$. This set $\mathcal{A}$ may denote the indices of u that were not yet encoded. $\mathcal{A}$ encoded.

Operation 606 defines a main loop of the process with r iterations, such that in iteration j, columns $\kappa^{(j)} \ldots \kappa^{(j+1)}-1$ of the main matrix are generated, where $\kappa^{(i)}$ is defined for example in box 608. This matrix denoted as $M_{(j)}$ has (m+p) rows and $k_j$ columns. In step 1 of operation 606, the information part of the matrix may be selected that is located on the first m+d$_j$ rows of the matrix (e.g., where $d_{r-1}$ is defined as 0 according to 610).

The specific assignment of indices of u to the matrix may be chosen arbitrarily. The set of indices of u selected on iteration j is called $\mathcal{A}^{(j)}$ and may be deleted from the set $\mathcal{A}$ to ensure that each index is selected exactly once. In step 2, the values of u in indices $\mathcal{A}^{(j)}$ may be ordered into a matrix of m+d$_j$ rows and $k_j$ columns. In step 4, each mega-column may have applied a systematic erasure correction code of p–d$_0$ parity mega-symbols. The parity of each mega-column may be concatenated as a column vector to the end of the column that served as information, creating sub-matrices $M^{(j)}$. After all the sub-matrices $M^{(j)}$ are created, the matrix M may be generated in operation 612 by concatenating the sub-matrices side by side. Only after the sub-matrices are concatenated may the matrix be completed according to operation 404 of FIG. 4 and the process allowed to propagate to the next stage of FIG. 4.

An additional generalization to the encoding approach in FIG. 5 may be introduced by providing outputs from operation 506 back as inputs into operation 504. In this way, results of encoding rows of the code may be provided as inputs to the encoder in operation 504. Such input may be used to generate further rows of the M matrix. Using this approach, in FIG. 6 input generated from operation 506 may be joined to the user data u to generate the matrix M.

Reference is made to FIG. 7, which is a flowchart of a process for generating an information matrix M, for example, used in operation 504 of FIG. 5, according to some embodiments of the invention.

The input (e.g., K information symbols) and output (e.g., an information matrix M) of the process of FIG. 7 is defined in 702. In this process, the main information matrix M is constructed row by row, thereby allowing transfer of rows to subsequent operations as soon as they are ready (before subsequent rows are generated and/or before the generation of matrix M is complete).

In operation 704, one or more processor(s) may initialize a set $\mathcal{A}$ of integer numbers $0, 1, \ldots, K-1$, may initialize matrix M, and may initialize r pairs of matrices $\tilde{M}^{(j)}$ and $\tilde{\tilde{M}}^{(j)}$.

Matrix $\tilde{M}^{(j)}$ contains the information rows and $\tilde{\tilde{M}}^{(j)}$ contains the corresponding erasure correction parity rows of sub-matrix $M^{(j)}$ consisting of columns $\kappa^{(j)} \ldots \kappa^{(j+1)}-1$ of the main information matrix M (e.g., where $\kappa^{(i)}$ is defined in 706). All matrices may be initially empty (e.g., having zero rows) in operation 704, and may be populated in subsequent operations in FIG. 7.

In operation 708, one or more processor(s) may execute a main loop of the process. The loop may have r iterations, such that in iteration j a sub-matrix of M is generated, for example, with rows in the range $(m+d_{r-j})$, $(m+d_{r-j}+1), \ldots, (m+d_{r-j-1}-1)$, where we define $d_{r-1} \triangleq 0$ and $d_r \triangleq -m$ (e.g., defined according to 710). In step 1 of the iteration, the indices of the information vector u may be selected, which are used to generate the information part of the rows of this stage. The subset of selected indices is denoted as $\mathcal{A}^{(j)}$ and is removed from $\mathcal{A}$ in order to ensure that each index is selected exactly once. As in FIG. 6, the selection of indices may be chosen arbitrarily. In step 2, the selected values of u corresponding to $\mathcal{A}^{(j)}$ are reshaped into a matrix B with $(d_{r-j-1}-d_{r-j})$ rows and $\kappa^{(r-j)}$ columns. These are the first $\kappa^{(r-j)}$ columns of the sub-matrix constructed here, corresponding to the information chunks. In step 3, the erasure parity columns are concatenated to matrix B (e.g., column by column). Note that in step j, $k-\kappa^{(r-j)}$ columns of erasure parity codes are generated. From each erasure parity matrix that was created, the first $(d_{r-j-1}-d_{r-j})$ rows may be concatenated to matrix B (e.g., column by column). Those rows may be omitted from the erasure parity matrix, so that they will be assigned exactly once. In step 3 of iteration j, sub-matrices $\tilde{\tilde{M}}^{(r-j)}, \tilde{\tilde{M}}^{(r-j+1)}, \ldots, \tilde{\tilde{M}}^{(r-1)}$ are accessed (e.g., for iteration j=0, the process may skip step 3). In step 4, matrix B may be concatenated to M as its last rows. It is possible to input matrix B into the next processing stage (e.g., operation 506 in FIG. 5). The next two steps 5 and 6 are preparations for the next iteration. In step 5, the matrices $\tilde{M}^{(j)}$ (e.g., the information parts of sub-matrices $M^{(j)}$) may be updated. Matrix $\tilde{M}^{(r-1-j)}$ may be completed in iteration j. Therefore, its erasure correction parity may be calculated and stored in $\tilde{\tilde{M}}^{(r-1-j)}$ to be used in the next iterations in step 7. Note that if $d_0 = p$, then step 7 may be skipped on the j=r−1 iteration.

Operation 712 may be executed, in some embodiments, only if $d_0 < p$. The last sub-matrix of M corresponding to rows $m+d_0, m+d_0+1, \ldots, m+p-1$ may contain only erasure parity symbols. As such, the processor(s) may only concatenate the remaining rows of all the erasure parity matrices $\tilde{\tilde{M}}^{(j)}$ in step 1 to matrix M. The resulting matrix M may be input in to the next stage in processing (e.g., operation 506 in FIG. 5).

Figure 8:
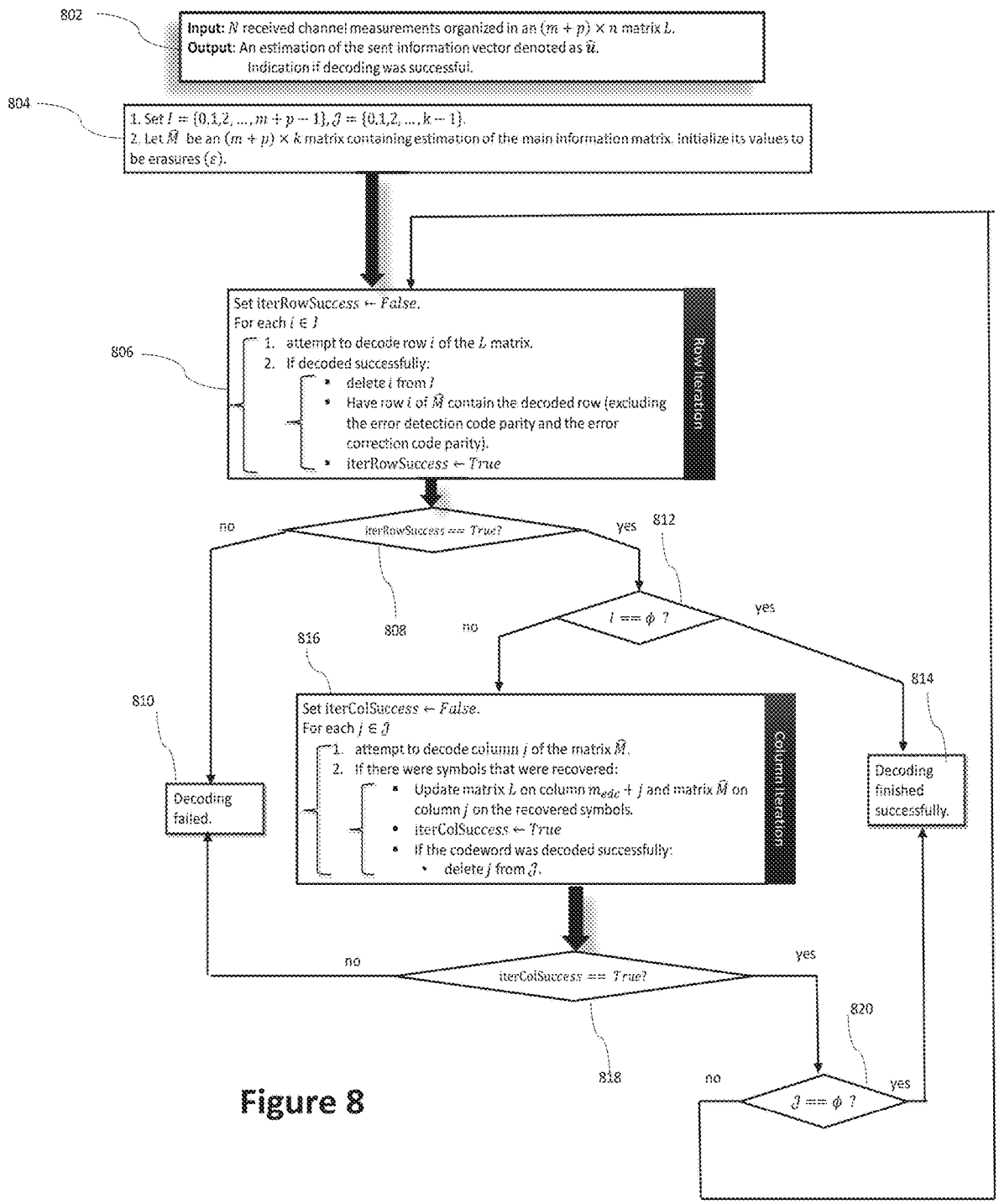
FIG. 8, FIG. 10 and FIG. 11 are flowcharts of processes for decoding a product code according to various embodiments of the invention.

Reference is made to FIG. 8, is a flowchart of a process for decoding a product code according to some embodiments of the invention.

The input and output of the process of FIG. 8 is defined in 802. In this embodiment, a matrix L comprising N received channel measurements is received, such that matrix element $L_{i,j}$ defines a measurement of the received symbol $Y_{i,j}$ corresponding to item (i,j) of the sent codeword matrix, denoted as $X_{i,j}$. Examples of such measurements include (but are not limited to):

Likelihood tuples: $L_{i,j} = \{Pr(Y_{i,j} = y_{i,j} \mid X_{i,j} = x)\}_{x \in F}$.

Log Likelihood tuples: $L_{i,j} = \{\log_2(Pr(Y_{i,j} = y_{i,j} \mid X_{i,j} = x))\}_{x \in F}$.

-continued

Log Likelihood ratio tuples: $L_{i,j} =$ $$\left\{\log_2\left(\frac{Pr(Y_{i,j} = y_{i,j} | X_{i,j} = 0)}{Pr(Y_{i,j} = y_{i,j} | X_{i,j} = x)}\right)\right\}_{x \in F - \{0\}}.$$

Hard decisions: $L_{i,j} = \underset{x \in F}{\operatorname{argmax}}\{Pr(Y_{i,j} = y_{i,j} | X_{i,j} = x)\}$ The output of the process may be an estimation of the information vector u, denoted here as û.

In some embodiments of the invention, one measurement of L may be jointly used for several symbols. In one example, a row of the product code is divided into chunks of $\hat{l}$ symbols, such that each chunk is modulated to a single constellation point. In this example, the matrix Y and L each contain $$(m+p) \times \left(\frac{n}{\hat{l}}\right)$$

measurements, and elements of matrix L may be defined, for example, as follows:

Likelihood tuples: $L_{i,j} =$ $$\{Pr(Y_{i,j} = y_{i,j} | X_{i,j\hat{l}} = x_0, X_{i,j\hat{l}+1} = x_1, \ldots, X_{i,(j+1)\hat{l}-1} = x_{\hat{l}-1})\}_{x \in F^{\hat{l}}}.$$

Log Likelihood tuples: $L_{i,j} =$ $$\{\log_2(Pr(Y_{i,j} = y_{i,j} | X_{i,j\hat{l}} = x_0, X_{i,j\hat{l}+1} = x_1, \ldots, X_{i,(j+1)\hat{l}-1} = x_{\hat{l}-1}))\}_{x \in F^{\hat{l}}}.$$

Log Likelihood ratio tuples: $L_{i,j} =$ $$\left\{\log_2\left(\frac{Pr(Y_{i,j} = y_{i,j} | X_{i,j\hat{l}} = 0, X_{i,j\hat{l}+1} = 0, \ldots, X_{i,(j+1)\hat{l}-1} = 0)}{Pr(Y_{i,j} = y_{i,j} | X_{i,j\hat{l}} = x_0, X_{i,j\hat{l}+1} = x_1, \ldots, X_{i,(j+1)\hat{l}-1} = x_{\hat{l}-1})}\right)\right\}_{x \in F^{\hat{l}} - \{0\}}.$$

Hard decisions: $L_{i,j} = \underset{x \in F^{\hat{l}}}{\operatorname{argmax}}$ $$\{Pr(Y_{i,j} = y_{i,j} | X_{i,j\hat{l}} = x_0, X_{i,j\hat{l}+1} = x_1, \ldots, X_{i,(j+1)\hat{l}-1} = x_{\hat{l}-1})\}.$$

In operation 804, one or more processor(s) may initialize variables including, for example, the set of row indices I of the main information matrix that were not yet decoded, and the set of columns indices $\mathcal{J}$ of the main information matrix that were not yet decoded. For example, before the first iteration, I and $\mathcal{A}$ may be initialized as I={0, 1, 2, . . . , m+p-1} and $\mathcal{A}$={0, 1, 2, . . . , k-1}. One or more processor(s) may also initialize matrix $\hat{M}$ of (m+p)×k dimensions, which may include estimations of successfully decoded rows of $\hat{M}$. Prior to a first iteration, one or more processor(s) may initialize all the elements of $\hat{M}$, for example, to be a special symbol defined as an "erasure" and denote, e.g., as ε. If $\hat{M}_{i,j}$=ε, then there may be insufficient information to properly estimate the i,j symbol of the main information matrix. If $\hat{M}_{i,j}$∈F, its information may be determined to be a reliable estimation of $M_{i,j}$.

After the initialization operation 804, one or more processor(s) may start an iterative process that includes two types of iterations: row iterations (operation 806) and column iterations (operation 816).

In operation 806, one or more processor(s) may execute the row iterations. First, one or more processor(s) may initialize an indicator variable iterRowSuccess that indicates whether at least one new row was decoded successfully in the current iteration. One or more processor(s) may enumerate rows that were not decoded successfully yet. One or more processor(s) may decode each unsuccessfully decoded row by executing a row decoder (e.g., an ECC decoder for the row ECC). If this decoding attempt is successful, the row index may be deleted from the list of non-decoded rows (I), and the estimated information part of the row may be copied to row i of $\hat{M}$ and the indicator variable iterRowSuccess may be toggled from False to True.

In operation 808, after the row iteration finished, one or more processor(s) may check whether any success occurred in the current iteration.

In operation 810, if no row was decoded successfully in the current iteration, one or more processor(s) may determine a "decoding failed" status.

In operation 812, if at least one row was decoded successfully in the current iteration, one or more processor(s) may check whether I is empty (e.g., indicating that all the rows were decoded successfully). If so, the product code decoding is completed successfully and one or more processor(s) may end the process in operation 814. Otherwise, at least one row failed decoding. In that case, one or more processor(s) may proceed to operation 816 to apply the column iteration process.

In operation 806, one or more processor(s) may execute the column iteration. First, one or more processor(s) may initialize iterColSuccess indicator to False. This variable indicates whether there was a column that had a successful decoding attempt in this iteration. One or more processor(s) may enumerate columns that were not decoded successfully yet in $\hat{M}$ and attempt to decode them using erasure decoding of the column. Note that the erasure decoding process receives as input the relevant column in $\hat{M}$ that may contain decoded symbols and erasures. If erasure decoding the column succeeded to recover at least one erased megasymbol, one or more processor(s) may update the corresponding column in M. One or more processor(s) may further update the input matrix L and toggle iterColSuccess to True. If the entire column is decoded successfully (i.e., no erasures remain), one or more processor(s) may eliminate j from $\mathcal{J}$.

In the example ECC structure in FIG. 1C, the erasure correction code may be located in mega-columns of the main information matrix each one of them contains m+p mega-symbols, which are sub-vectors of the row elements of M. It is therefore understood, in some embodiments, that stating that a symbol in column j∈ $\mathcal{J}$ is recoverable, means that its mega-symbol is recoverable. As such, when recovery occurs all the indices of a mega-symbol may be recovered, and if an entire mega column is recovered all its column indices may be eliminated from $\mathcal{J}$.

The update of matrix L on column $m_{edc}$+j may be such that the validated decoded values rows reflect the decoded value with full certainty. For example, consider the case in which the input information includes binary code and log likelihoods ratio $$LLR_i = \log_2\left(\frac{Pr(Y_i = y_i | X_i = 0)}{Pr(Y_i = y_i | X_i = 1)}\right).$$

An example column decoder may determine that a certain symbol of index i may have a value b∈{0,1}. In this case, for example, $LLR_i = (-1)^b \cdot \infty$, where ∞ may denote infinity (e.g., in terms of the decoding system's algebra) or a limit approaching infinity. Such an input may be applicable, according to some embodiments of the invention, when the row code is systematic.

In case the row ECC is non-systematic (e.g., non-systematic polar code), one or more processor(s) may update a frozen indicator list of row codes to have the specific recovered symbol frozen with the decoded value b as the frozen value. Accordingly, the next row iterations may use expurgated versions of the row codes (e.g., having fewer candidate codewords) and consequently there may be a better chance of decoding the codewords. For example, in some cases, the expurgated versions may have a higher minimum distance (e.g., minimum bit flit difference) between codewords than the original versions and consequently higher resiliency to noise.

In operation 818, after the column iteration finishes, one or more processor(s) may check a success condition. If no column was added to the list of decoded column, one or more processor(s) may determine a decoding failure 810.

Otherwise, in operation 820, if all the columns were decoded, one or more processor(s) may determine a decoding success and may output the rest of the rows that were decoded. Otherwise, one or more processor(s) may return to the row iteration (operation 806) and perform an additional decoding attempt.

In FIG. 3, if $d_0<p$, then the last $d_0-p$ rows of the main information matrix contain only ErasureParity chunks. In some embodiments of the invention, if $d_0<p$ and in operation 806 $I \subseteq \{m+d_0, m+d_0+1, \ldots, m+p-1\}$ (e.g., all the remaining rows that were not decoded are from the set of last $d_0-p$ rows), then one or more processor(s) may determine a decoding success.

In some embodiments of the invention, a successful decoding may result in retrieving the information chunks from $\hat{M}$ and placing them in the estimated information vector $\hat{u}$.

Figure 9:
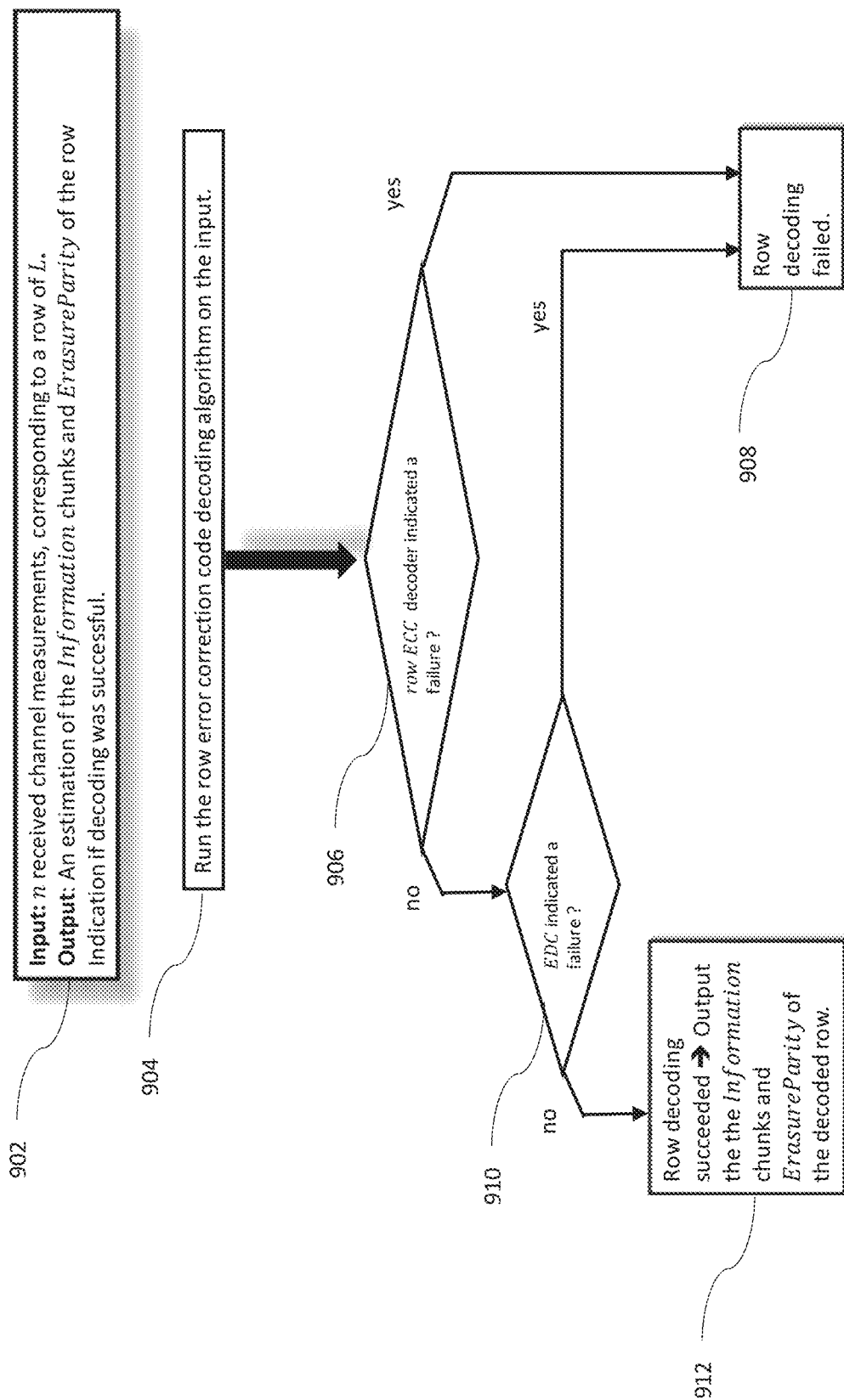
FIG. 9 is a flowchart of a process for decoding rows of a product code according to some embodiments of the invention.

Reference is made to FIG. 9, which is a flowchart of a process for decoding a row of a product code, for example, as performed in operation 806 of FIG. 8, according to some embodiments of the invention.

The input and output of the process of FIG. 9 is defined in 902. The input may include the n received channel measurements corresponding to a row from the L input matrix. In cases in which the row code is non-systematic or partially systematic, the input may also include additional side information that was derived from previous column iterations (e.g., an updated list of frozen symbols). The outputs may include the parts of the codeword that belongs to the main information matrix (e.g., the decoded row excluding error detection code parity EDCParity$_i$ 310, and the row error correction code parity RowParity$_i$ 312) and/or an indicator of the success of the decoding process.

In operation 904, one or more processor(s) may run the row ECC decoding process on the input. Examples of ECC decoding algorithms may include but are not limited to, Belief Propagation (BP) for LDPC codes, BP or Successive Cancellation with List (SCL) for polar codes, BCJR or Viterbi algorithm for convolution codes and Berlekamp-Massey algorithm incorporated with Chase algorithm for BCH or RS codes. Some of those algorithms have indications on decoding failures. For example, in BP, one or more processor(s) may verify that the decoded codeword fulfills the code constraints such as the code's parity check matrix in LDPC codes or the frozen symbols fixed values in polar codes.

In operation 906, one or more processor(s) may check if the row decoder indicated such a failure. If so, the decoding is indicated as a failure in operation 908. If no failure was reported, one or more processor(s) may check the error detection codeword in operation 910. If the error detection check indicated a failure, then one or more processor(s) may report a failure in operation 908. Otherwise, one or more processor(s) may determine a successful row decoding in operation 912 and may output the decoded information part.

Figure 10:
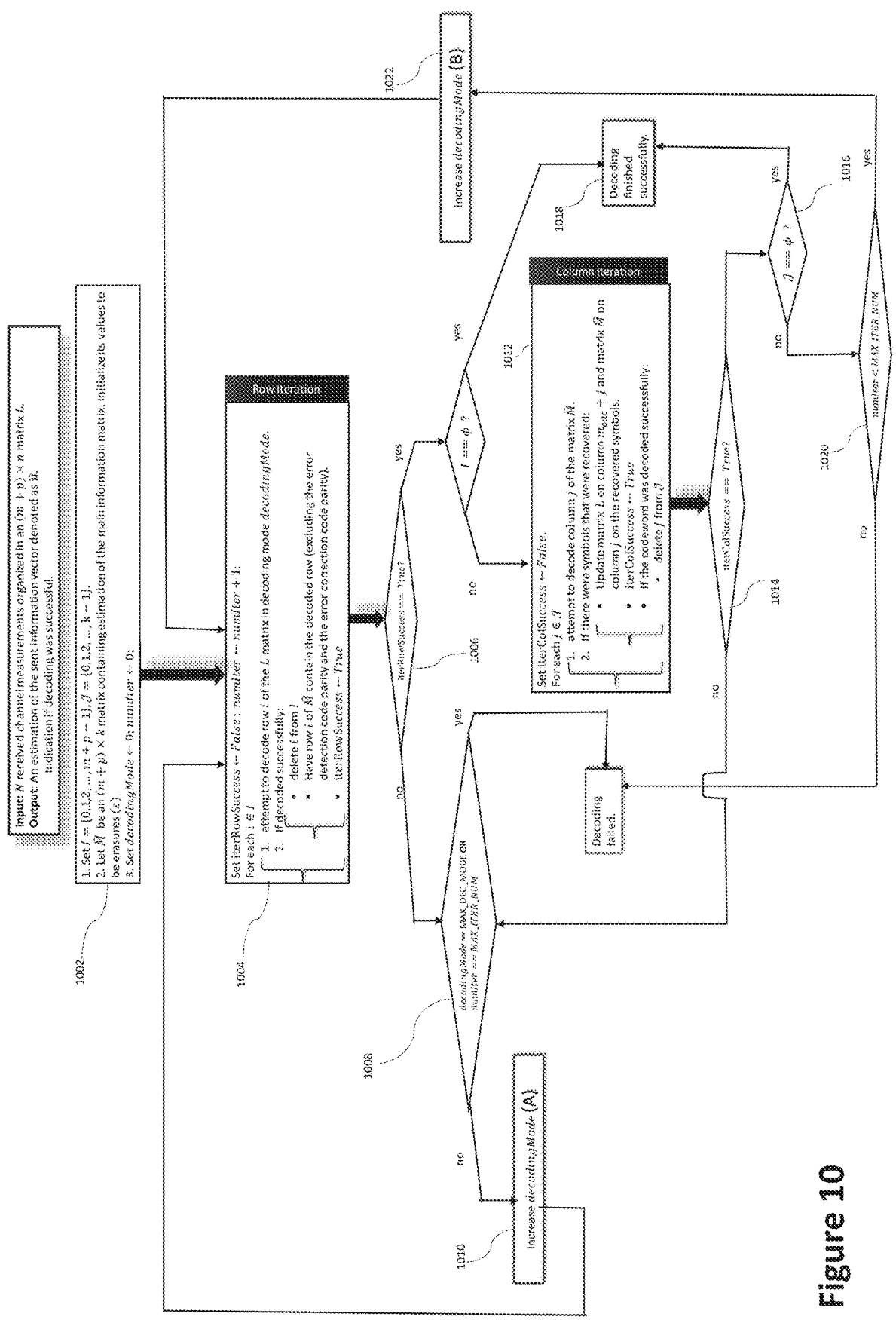

Reference is made to FIG. 10, which is a flowchart of a generalization of the decoding process of FIG. 8, according to some embodiments of the invention. Emphasizing the differences in the process of FIG. 10 compared to the process of FIG. 8, in the initialization operation 1002, one or more processor(s) may initialize two new variables, for example:

decodingMode—Indicates the computational effort or performance of the row iteration mechanism in the decoding process. As the decodingMode increases, the error correction capability of the row decoding process also improves, involving an increase in the complexity, time, memory usage, and/or power consumption. According to some embodiments of the invention, in most cases, a "low power" decoding mode provides sufficient performance, which results in low consumption of resources and/or faster decoding. However, in cases in which the lower power decoding mode does not achieve a desired (e.g., threshold) performance, one or more alternate or additional high performance decoding modes (e.g., with higher resource consumption) may be used to elevate the mode of operation (e.g., a mode that may correct more errors but uses more time, more memory usage, and/or power consumption of the decoding process). The maximum decoding mode is denoted MAX_DEC_MODE. Examples of implementations of a high power or maximum decoding mode may include, but are not limited to:

a. Increasing the number of iterations in BP as the decoding mode increases.

b. Increasing the fixed-point resolution as the decoding mode increases.

c. Using hard-bit decoding for decodingMode==0 and soft decision decoding for decodingMode>0.

d. Increasing the list size in sequential decoding of convolution codes, or list successive cancellation (SCL) in polar codes, as decodingMode increases.

e. Increasing the number of considered candidates in the chase algorithm as the decoding mode increases.

It should be understood that the above are only examples and a decodingMode case may include combination of the above or further options. The implementation may have a relational table or data structure of available modes with their corresponding decoding specifications.

numIter—Indicates the number of times the row iteration process was performed. This variable is used to limit the processing time of the algorithm by comparing it to a maximum number of iterations, MAX_ITER_NUM, which may be a tunable parameter of the process.

In operation 1004, one or more processor(s) may increase the iteration number to commence the row iteration block.

In operation 1006, upon completing the row iteration block, one or more processor(s) may check if at least one row was successfully decoded at the previous iteration. If no row was decoded successfully, the process may proceed to operation 1008. In operation 1008, one or more processor(s) may determine that this condition decoding fails if either the maximum number of iterations is reached (numIter=MAX_ITER_NUM), or the maximum decoding mode is applied. Otherwise, in operation 1010, one or more processor(s) may increase the decodingMode variable and return to operation 1004. According to some embodiments of the current invention, operation 1010 may be implemented according (but not limited) to the following options:

Opt0: Independent increase: decodingMode←decodingMode+1.

Opt1: Implement dependency with the difference between MAX_ITER_NUM and numIter, e.g., $d_{iter}$=MAX_ITER_NUM−numIter. For example, as $d_{iter}$ decreases (e.g., indicating a decreasing number of remaining iterations), decodingMode increases. At the extreme case or limit, e.g., $d_{iter}$=1, decodingMode←MAX_DEC_MODE.

Opt2: Implement dependency with |I| (number of non-decoded rows) and $d_{iter}$, such that as |I| increases, the decoding mode, decodingMode, also increases.

Opt3: Implement dependency with the previous iteration number that caused an increase of the decodingMode. For example, if the decoder increased the decodingMode T iterations ago, the decoder may change the decodingMode based on τ (e.g., if τ is less than a threshold value, increase decodingMode by a larger gap than the standard increase).

After completing the column iteration (operation 1012), in operation 1014, one or more processor(s) may check a condition for iteration success. If no erased symbol was successfully recovered in the current iteration, the process may proceed to operation 1008. In operation 1008, one or more processor(s) may determine if the number of iterations<MAX_ITER_NUM, and if so, in operation 1010 may increase the decoding mode for the next row iteration. Otherwise there was at least one column that was successfully decoded in the previous iteration. If all the columns were decoded as determined in operation 1016, one or more processor(s) may declare a successful decoding in operation 1018. Otherwise, one or more processor(s) may compare numIter to MAX_ITER_NUM in operation 1020. If numIter≥MAX_ITER_NUM, one or more processor(s) may determine a decoding failure. Otherwise, if numIter<MAX_ITER_NUM, one or more processor(s) may return to operation 1004 to attempt to perform an additional row iteration. In operation 1022, prior to repeating the row iteration, one or more processor(s) may increase the decoding mode, for example, by logic (B) that may be different than logic (A) used in operation 1010. For example, in operation 1010 one or more processor(s) may increase decodingMode, whereas in operation 1022 this increase is optional. Additionally, or alternatively, operation 1022 and/or operation 1010 may be implemented according to options Opt0, Opt1, Opt2 and Opt3 above (each operation may use the same or different option and/or the same or different parameter configurations). The implementations of both operations 1022 and 1010 are provided only as examples of embodiments and are not meant to be limiting in any way.

A device or system operating according to some embodiments of the invention may include hardware (e.g., decoder(s) 126 of FIG. 1A and/or 168 of FIG. 1B) configured to decode rows in operation 1004 (either in sequence or in parallel) and/or configured to decode columns in operation 1012 (either in sequence or in parallel).

According to some embodiments of the invention, one or more processor(s) may implement bounded distance erasure correction decoding in the column iteration block (e.g., operation 816 in FIG. 8 or 1012 in FIG. 10). As such, for each column there may be a maximum number of erasures that can be recovered. Consequently, before decoding a column j, one or more processor(s) may verify that the number of detected erasures is not greater than the maximum number of erasures that can be recovered. Moreover, $\mathcal{J}$ may be ordered according to the decoding capability of column codes, such that in the column iteration, the members of $\mathcal{J}$ are ordered according to the number of recoverable erasures in each column, starting with the column with a maximum number of recoverable erasures. If the column is decoded successfully, the members of $\mathcal{J}$ are incremented to the next column with the maximum number of recoverable erasures. If the column is not decoded successfully (e.g., the number of erasures is above the recovery capability of the erasure codes), $\mathcal{J}$ is not incremented and decoding stops. This is because if a column with the maximum number of recoverable erasures $n_e$ cannot be decoded, then any codeword with a smaller than maximum number of recoverable erasures $n_{<e}$ also cannot be decoded.

Figure 11:
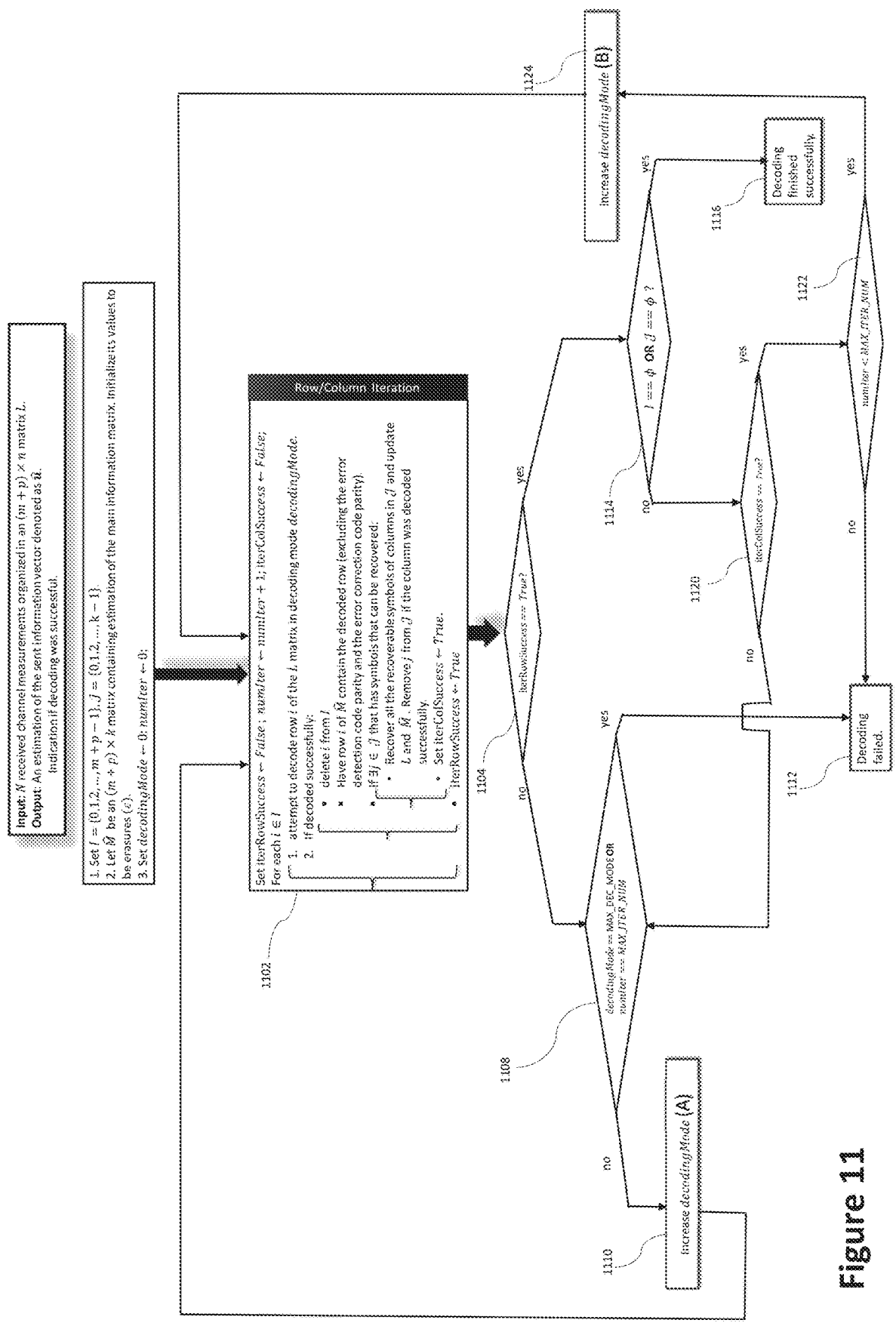

Reference is made to FIG. 11, which is a flowchart of a process for decoding a product code, in which the row and the column iterations are combined into a single iteration, according to some embodiments of the invention. The row and column iterations are combined by successively decoding rows and columns in pairs. Each successful decoding of a row of I in which the row's values are updated in $\hat{M}$ may be followed by an attempt to decode one or more columns. In some embodiments of the invention, the column erasure decoder is a bounded distance decoder allowing easy selection of the columns that can be successfully decoded. If indeed some symbols in a column are decoded, one or more processor(s) may update matrices L and $\hat{M}$ (e.g., see operation 1012 in FIG. 10). If the column is decoded successfully, one or more processor(s) may remove it from $\mathcal{J}$. One or more processor(s) may indicate successful recovery of symbols by toggling iterColSuccess←True. In operation 1104, after such an iteration ends, one or more processor(s) may check that at least one row was decoded successfully. In operation 1108, if no row was decoded successfully, one or more processor(s) may check that it is possible to perform an additional iteration and increase the decoding mode. If this is possible, one or more processor(s) may increase the decodingMode indicator and return to operation 1102 for an additional iteration. If the decoder reached the maximum number of iterations or the maximum decoding mode, one or more processor(s) may determine that the decoder failed in operation 1112. Returning to operation 1104, if there was an additional row that was decoded successfully, then the process may proceed to operation 1114. In operation 1114, one or more processor(s) may determine whether there are no rows or no columns to decode. If so, one or more processor(s) may determine that the decoding operation succeeded in operation 1116. Otherwise, in operation 1120, one or more processor(s) may check if in addition there were any erasures that were recovered in column codewords. If there were not such erasures, one or more processor(s) may increase the decoding mode in operation 1110. Otherwise, an additional iteration may be needed. One or more processor(s) may check if the maximum number of iterations is reached in operation 1122 and, if not, the process may proceed to perform an additional iteration, potentially increasing the decodingMode in operation 1124. As discussed in reference to FIG. 10, the logic (A) employed to increase the decodingMode in operation 1110 may be the same or different than the logic (B) employed to increase the decodingMode in operation 1124.

A device or system operating according to some embodiments of the invention may include hardware (e.g., decoder(s) 126 of FIG. 1A and/or 168 of FIG. 1B) configured to decode rows and/or columns in operation 1102 either in sequence or in parallel.

According to some embodiments of the invention, the decoder may output rows as soon as they are decoded successfully (e.g., prior to decoding the next or one or more subsequent rows). In some embodiments of the invention, rows that were not decoded successfully may be output as a hard decision of the original input, for example, including recoveries made by the columns code decoder. In some embodiments, rows that were not decoded successfully may be output as a decoded word of the row ECC decoder, for example, including the erasure recoveries made by the column code decoder.

Some embodiments of the invention implement the structure in FIG. 1C with the following example configurations. Let $q=2^\theta$ and choose k to be a multiplication of $\theta$. Error detection code may be a CRC of $m_{edc}$ bits and the row error correction may be a binary row code (e.g. LDPC, polar code, etc.) with redundancy size $m_{row}$. The column erasure correction code may be a systematic (and possibly shortened) Reed-Solomon code of length (m+p) and parity size p symbols over GF(q). To support this example, m+p≤q. The column code may be defined such that in each row of M the first $\theta$ bits define the first GF(q) symbol, the next $\theta$ bits define the second GF(q) symbol, and so on. The Reed-Solomon code may be applied on column of GF(q) symbols. Note that Reed-Solomon codes can typically recover up to p erasures.

According to some embodiments of the present invention, a row that is not decoded or recovered may be provided as an output of the row ECC decoder, for example, together with an indicator that the entire product codeword was not successfully decoded. The code structure allows estimations of the upper bounds on the block error rate (BLER) and bit error rate (BER) of the decoding system given simulation results of the row ECC decoder.

Figure 12:
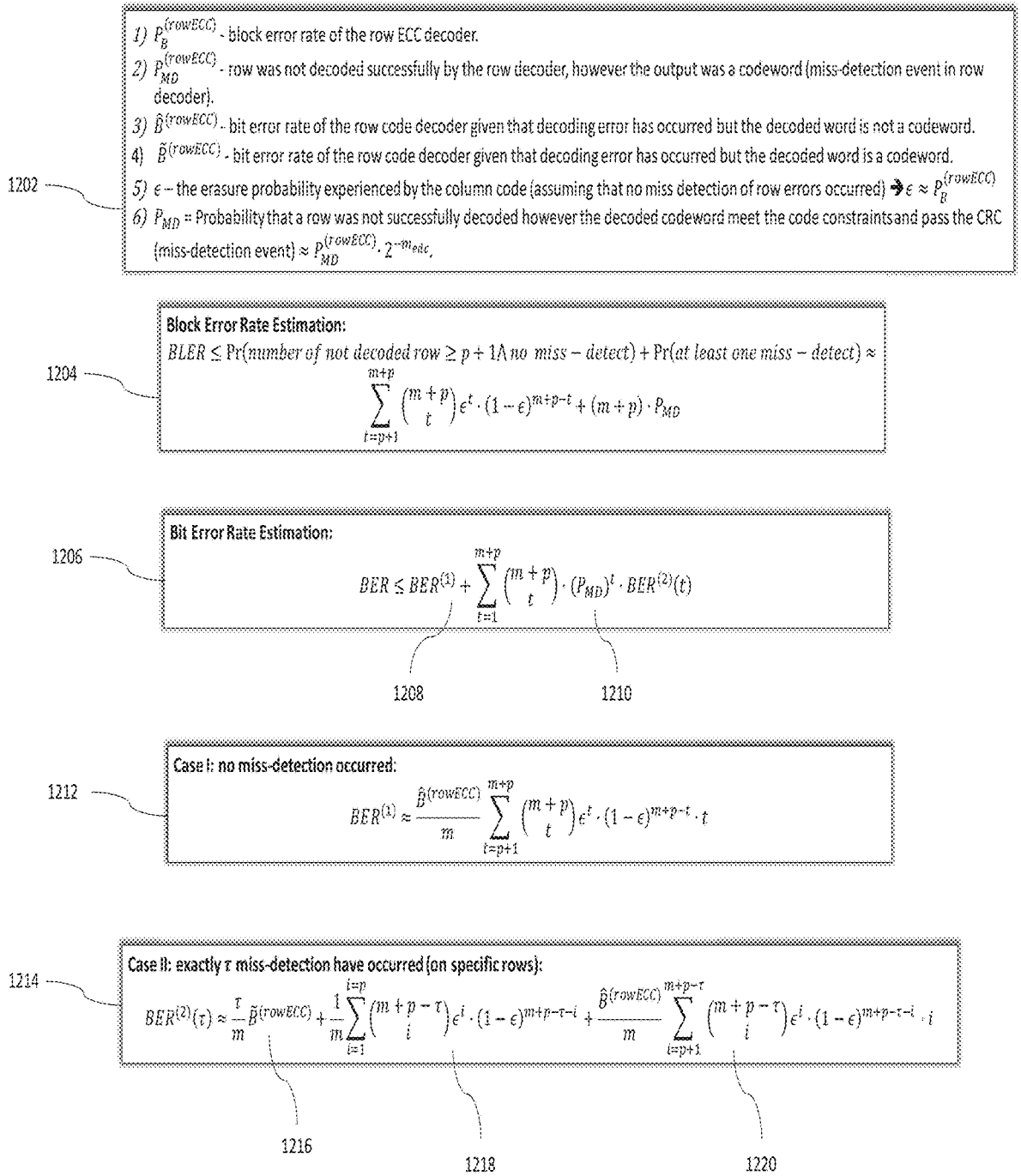
FIG. 12 depicts estimations and bounds on block error rate and bit error rate according to some embodiments of the invention.

Reference is made to FIG. 12, which illustrates a process for estimating the block error rate (BLER) and bit error rate (BER) of the decoding system, according to some embodiments of the invention.

Box 1202 provides some definitions and notation. The first four terms (1)-(4) may be measured by employing a simulation of the row ECC decoder. Specifically, $P_B^{(rowECC)}$ is the BLER of the row ECC decoder and $P_{MD}^{(rowECC)}$ is the probability of decoding failure in row ECC in which the decoded word is a codeword (however, the wrong one). The latter event is also known as the row ECC decoding misdetection event. $\hat{B}^{(rowECC)}$ and $\tilde{B}^{(rowECC)}$ are BER measures that are conditioned on the event of decoding failure of the row ECC decoder. The difference between these measures is that $\hat{B}^{(rowECC)}$ is conditioned on the event that the decoded word was not a codeword (thereby the row ECC decoder can detect this error event), while $\tilde{B}^{(rowECC)}$ is conditioned on the event that the decoded word is a codeword (but the wrong one). The next parameter (5) is the erasure probability experienced by the column erasure correction decoder (and no misdetection of row errors occurred), denoted as e. This erasure probability may be approximated by $P_B^{(rowECC)}$ (which is an upper-bound because it includes all the error events, even those that are not detectable). The next parameter (6), $P_{MD}$ is the probability of misdetection (e.g., at least one row failed to be decoded by the ECC and was not detected by the ECC or EDC). The probability of this event may be estimated, e.g., as a multiplication of two probabilities: $P_{MD}^{(rowECC)}$ and a probability of misdetection in the CRC (approximated by $2^{-m_{edc}}$).

Boxes 1204 and 1206 define upper-bounds for the BLER and BER of the construction, respectively.

In 1204, the BLER may be calculated based on two events: (i) at least one row misdetection has occurred (e.g., approximated by $(m+p) \cdot P_{MD}$) (ii) no misdetection of a row occurred and the number of erased rows is beyond the column code erasure recoverability.

In 1206, the BER may be calculated based on a summation of two terms: term 1208 defines $BER^{(1)}$ for the case in which no misdetection occurred and term 1210 defines $BER^{(2)}$ for the case that at least one misdetection occurred. Box 1212 shows the computation for $BER^{(1)}$. Box 1214 shows the computation for $BER^{(2)}$ for the case that exactly τ rows had misdetection events. Those rows are assumed to be specific (e.g., the first τ rows of the codeword matrix). The event may be approximated by the following components:

Term 1216 represents the $BER^{(2)}$ contribution of the rows that had misdetection. The column decoder typically does not change this term, which therefore outputs the BER of the row-ECC decoder assuming a row ECC decoder misdetection occurred.

Terms 1218 and 1220 are based on enumeration of the events that i decoding failures occurred on the rest of the rows.

Term 1218, −1≤i≤p: The number of detected errors is less than the recovery capability of the column code. As a consequence, the column code may be used to recover those i rows. However, due to the rows that were not decoded correctly, this recovery may be erroneous. In this case, the BER may have an upper bound, e.g., of '1'.

Term 1220, −p+1≤i≤m+p−τ: The number of detected errors is greater than the recovery capability of the column code decoder. As a consequence, the column code may not be used to recover those rows. As such, the term may define the BER of the row code decoder (e.g., assuming that an error occurred and was detected).

Example

Consider the case of the aforementioned embodiment with m=64, p=2, n=4400 bits, k=3824 bits, $m_{edc}$=26 bits.

Each row code may be an LDPC and the error detection code may be CRC with 26 bits. The column erasure correction code may be a shortened Reed-Solomon with symbols size θ=8 bits. The code length may be N=(m+p)·n=290,400 bits and the code rate may be $$R = \frac{k \cdot m}{n} = 0.8428.$$

Figure 13:
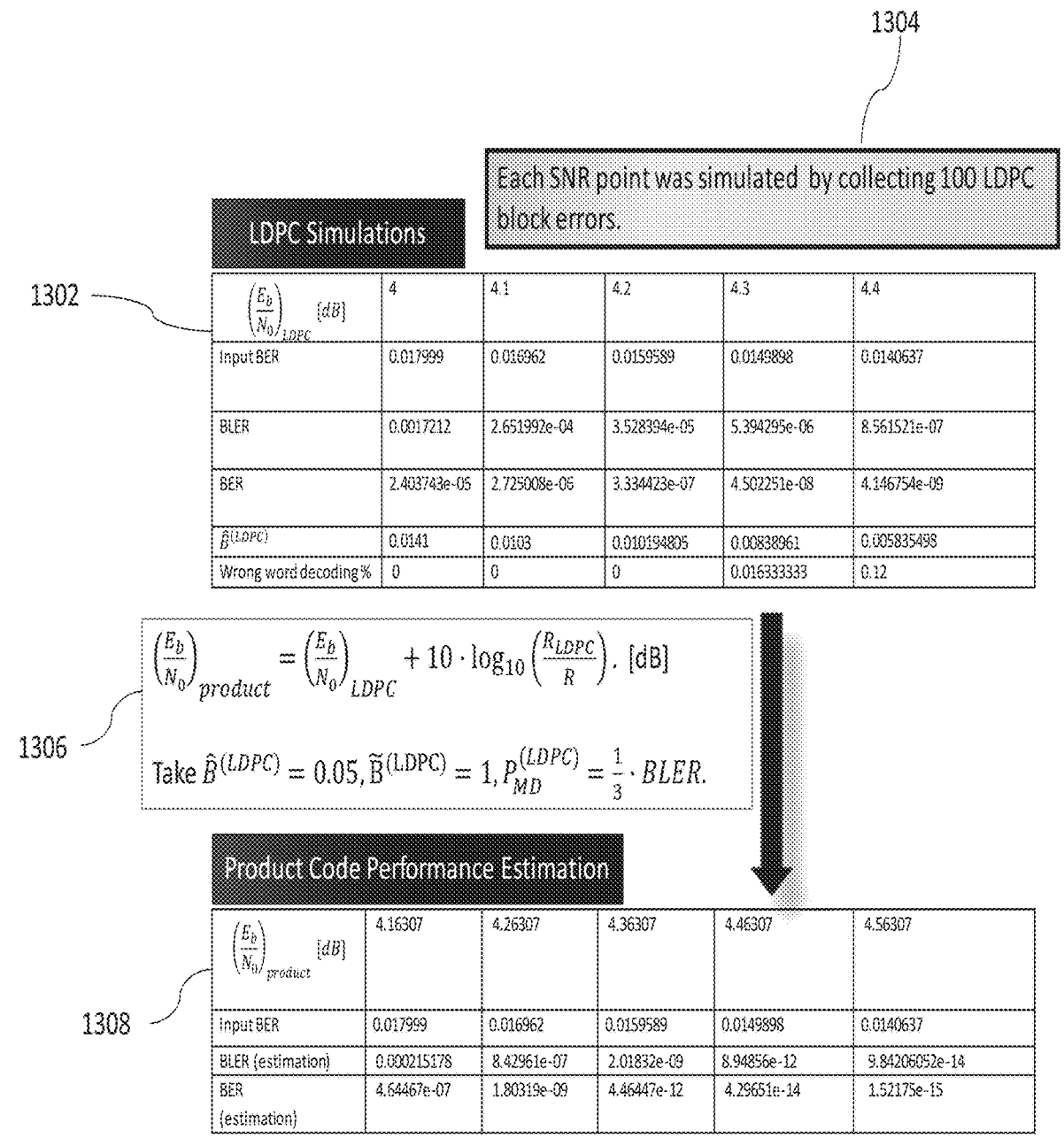
FIGS. 13-14 depict results of error correction performance employing simulation results of a row decoder and analysis, for example, according to metrics defined in FIG. 12, according to an embodiment of the invention.

The LDPC code may be a quasi-cyclic binary irregular code of block length 4400 bits and information length 3850 (e.g., lifting factor is Z=55). A serial schedule BP algorithm may be used with a maximum of 20 iterations as a row decoder. The column decoder may be a solver of a system of two equations with two variables over GF(256). FIG. 13 contains performance estimation metrics for the decoder using binary phase-shift keying modulation (BPSK) over a Gaussian channel.

This estimation may initially involve collecting results of the LDPC row simulation. Table 1302 contains empirical estimations of several parameters. The SNR measured in dB is in $E_b/N_0$ [dB] units where $E_b$ is the energy per bit, which is $$\frac{E_s}{R_{LDPC}}$$

(e.g., where $E_s$ is the energy per channel use, and $R_{LDPC}$ is the LDPC rate). $N_0=2\sigma^2$, where $\sigma$ is the Gaussian noise standard deviation. The input BER in 1302 is the uncoded bit error rate of the channel (e.g., the achieved BER if no ECC is employed). The rest of the rows contain the empirical results of the simulation. As indicated in 1304, each SNR value was obtained by simulating frames until e.g., at least 100 block decoding errors were captured.

Figure 14:
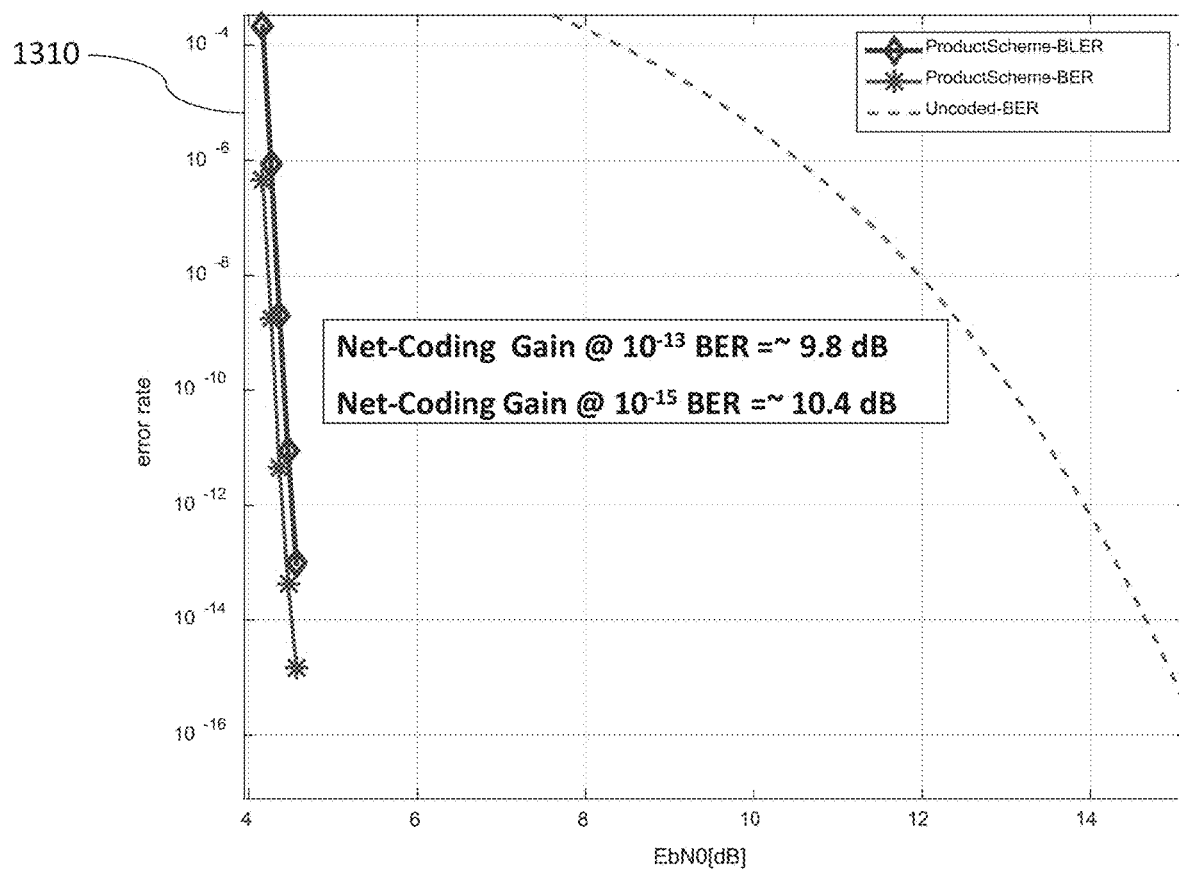

The translation between the simulated LDPC row code and the performance estimation of the entire product code may be computed according to the 1306. Firstly, the $$\frac{E_b}{N_0}$$

of the product code may be greater than that of the LDPC code because the rate of the product code is smaller than that of the LDPC. Secondly, some embodiments of the invention may use overestimations of $\hat{B}^{(LDPC)}$, $\tilde{B}^{(LDPC)}$ and $P_{MD}^{(LDPC)}$ as shown in 1306 (e.g., note that those parameters correspond to $\hat{B}^{(rowECC)}$, $\tilde{B}^{(rowECC)}$ and $P_{MD}^{(rowECC)}$ from FIG. 12). Employing FIG. 12 techniques may result in the BER and BLER estimations in 1308. The error curves in 1310 in FIG. 14 may demonstrate the performance of this coding system versus an uncoded system. The term Net-Coding Gain (NCG) @ BER=b defines the gap in the $$\frac{E_b}{N_0}$$

axis between the uncoded BER curve to the coded scheme BER curve measured at BER=b.

Figure 15:
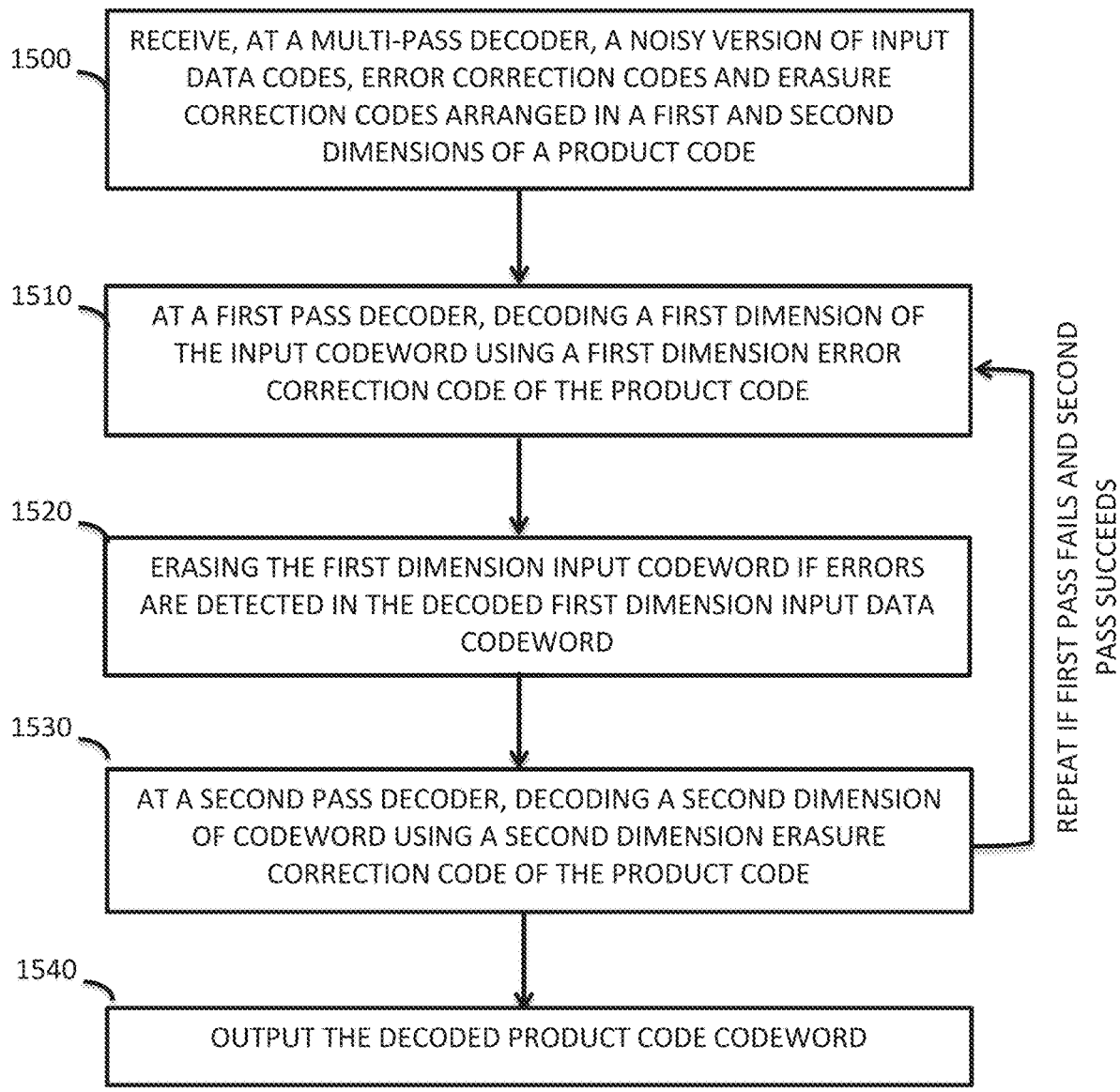
FIG. 15 is a flowchart of a method for decoding a product code comprising erasure codes according to some embodiments of the invention.

Reference is made to FIG. 15, which is a flowchart of a method for decoding a product code including a plurality of first and second dimension codewords generated by encoding input data by a plurality of first and second dimension error correction codes according to some embodiments of the invention. Operations described in reference to FIG. 15 may be performed using devices, for example, described in reference to FIG. 1A or FIG. 1B, although other systems and devices may be used. In one example, operations 1500-1540 may be performed using one or more receiver processor(s) 120 of FIG. 1A. In another example, operations 1500-1540 may be performed using one or more ECC decoder processor(s) 180 of FIG. 1B.

In operation 1500, one or more processor(s) (e.g., receiver processor(s) 120 of FIG. 1A or memory controller decoder processor(s) 180 of FIG. 1B), e.g., in a multi-pass decoder, may receive a noisy or distorted version of one or more input codewords, having constituent error correction codewords and erasure correction codewords arranged in a first and second dimensions of a product codeword. In some embodiments, in operation 1500, the received codewords may have been transmitted by a source device (e.g., transmitter 110 of FIG. 1A) to a receiver device (e.g., receiver 112 of FIG. 1A) over a communication channel. In some embodiments, in operation 1500, the received codewords may have been retrieved that were previously programmed into memory die(s) (e.g., 174 of FIG. 1B) by a memory controller (e.g., 158 of FIG. 1B) using an ECC encoder processor (e.g. 176 of FIG. 1B). The received codewords may include one or more (e.g., all) distorted or erroneous codewords (e.g., different than the stored or transmitted codewords), or may include a mix of distorted and non-distorted codewords.

The product codeword may be arranged in a matrix as described in reference to FIGS. 1C, 2 and/or 3 (other product code configurations may also be used). The matrix, user input data portion, and/or erasure code portion may have a rectangular shape (e.g., information portion and erasure code portion in FIG. 1C), square, L-shape (e.g., information portion in FIG. 2), T-shape, U-shape, stair-stepped (e.g., information portion and erasure code portions in FIG. 3), or any other grid shape. In some embodiments (e.g., shown in FIG. 1C), the erasure codewords of a second dimension (e.g., column codewords 113) may span the entire length of the input information along the first dimension (e.g., 106), such that, each data element in the first dimension input data (e.g., input data Information$_i$ 106) is encoded by an intersecting orthogonal second dimension erasure correction code (e.g., column codes 113). In some embodiments (e.g., shown in FIG. 2), the matrix of input data words is divided into a plurality of data blocks (e.g., 202 and 204), such that, one or more first data blocks (e.g., Information$_{i,1}$ in 204) are encoded by both first dimension error correction codes (e.g., with parity 207) and second dimension erasure correction codes (e.g., with parity 206) and one or more second data blocks (e.g., Information$_{i,0}$ in 202) are only encoded by first dimension error correction codes (e.g., with parity 207) but not second dimension erasure correction codes. In some embodiments (e.g., shown in FIG. 3), the product code may include a stair-step arrangement of sequential input data blocks of different sizes (e.g., $(m+d_0) \times k_0$, $(m+d_1) \times k_1$, ..., $(m+d_{r-2}) \times k_{r-2}$, $m \times k_{r-1}$) encoded by erasure code blocks (e.g., 302-308), wherein each sequential input data block in the product code (e.g. the rows Information$_{i,j}$ for the $j^{th}$ block) are encoded by an erasure code (e.g., 308-302) of incrementally increasing or decreasing redundancy length (e.g., p, p−($d_{r-2}$), p−($d_1$), ..., respectively).

In operation 1510, the one or more processor(s) may execute a first pass of the multi-pass decoder for each of a plurality of first dimension input codewords. In the first pass, the multi-pass decoder may decode the first dimension input codeword using a first dimension error correction code.

In operation 1520, the one or more processor(s) may erase the first dimension input codeword (e.g., or a segment or element thereof) if errors are detected in the decoded first dimension input codeword (e.g., if the first pass decoding in operation 1510 fails to decode the first dimension input codeword). Thus, the first pass decoding is an erasure channel that inserts erasures into the product codeword in operation 1520 for the second pass decoding to correct with the erasure correction codes in operation 1530. The one or more processor(s) may determine if the first dimension codeword decoded in operation 1510 has any (or an above threshold number of) errors remaining (e.g., if the first pass decoding failed) using error detection codes (e.g., 108 of FIG. 1C) or re-using error correction codes for error detection (e.g., 109 of FIG. 1C).

In operation 1530, the one or more processor(s) may execute a second pass of the multi-pass decoder for each of a plurality of second dimension input codewords. In the second pass, the multi-pass decoder may decode the second dimension input codeword using a second dimension erasure correction code decoder to correct an erasure in the second dimension input codeword that was erased in the first dimension decoding (e.g., an erasure inserted in the first pass). In some embodiments, the second pass decoding is only executed if the first pass decoding fails (e.g., if a first dimension input codeword is erased) for a corresponding intersecting second dimension codeword.

A process or processor(s) may repeat the first and/or second pass decoding in operations 1510 and/or 1530 for one or more iterations, for example, if one or more codewords contain errors after the first iteration of the first and second passes. In one embodiment, a process or processor(s) may repeat the first pass decoding if the initial first pass decoding of a first dimension input codeword fails and the second pass decoding of one or more intersecting second dimension codewords succeeds in operation 1530. Repeating first pass decoding operation 1510 may propagate any corrected erasures from the second pass to increase the probability of successfully decoding a first dimension input data that had previously failed to decode in the initial iteration of the first pass.

Operations 1510-1530 may repeat for each of a plurality of first and second dimension codewords (e.g., row and column codewords). Operations 1510-1530 may repeat for each of a plurality of sequential data blocks (e.g., column pillars 202-204 of FIG. 2 or column pillars 302-308 of FIG. 3). First pass decoding in operation 1510 may be executed sequentially or in parallel for each of a plurality of first dimension input codewords in a product codeword or sub-block of a product codeword. Second pass decoding in operation 1530 may be executed sequentially or in parallel for each of a plurality of second dimension input codewords in a product codeword or sub-block of a product codeword. First and second pass decoding in operations 1510 and 1530 may be executed sequentially or in parallel for each input codeword in the product code.

In operation 1540, the one or more processor(s) may output the decoded input codewords. The processor(s) may perform operations or task on the decoded codewords, deliver the decoded codewords to memory units for further processing or to a host (e.g., memory unit 124 of FIG. 1A or host 150 of FIG. 1B), display the data on a display device (e.g., of receiver 112 of FIG. 1A), or perform other output operations on the decoded input codewords.

Other operations or orders of operations may be used.

In accordance with an embodiment of present invention, executed "in parallel" as used herein may refer to executed substantially concurrently, simultaneously, during the same iteration, prior to completion of a subsequent iteration, or during completely or partially overlapping time intervals.

In some embodiments of the invention, the first dimension is a row dimension and the second dimension is a column dimension, while in other embodiments of the invention, the first dimension is a column dimension and the second dimension is a row dimension. Accordingly, embodiments of the invention that describe rows and columns may also cover product codes in which the rows and columns are inverted or transposed into columns and rows, respectively. For example, although row codes are described to include parity ECC and/or EDC, and column codes are described to include erasure codes, the orientation of the rows and columns (and their decoding order) may be inverted, such that row codes include erasure codes and column codes include ECC and/or EDC.

Although product codes are described as having two dimensions (e.g., row codes in a first dimension and column codes in a second dimension), embodiments of the invention may include product codes having any plurality of ($l_D$) dimensions comprising ($l_D$) orthogonal and independent codes encoding each data element. Thus, each data element may be encoded and decoded by ($l_D$) ECC, for example, sequentially or in parallel. In one embodiment, the ($l_D$) codes may be executed sequentially until the EDC decoder indicates there are no or below threshold number of errors remaining.

Data structures that are row or column codes (or first or second dimension codes) may be stored or represented as standard or linear codes with their implementation as either row or column codes (or first or second dimension codes) designated, for example, by row or column (or dimension) tags or identifiers, by the sequential order of the codes or codewords (e.g., user information stored first, then row or first dimension redundancy codes second, then column or second dimension redundancy codes third), or by their locations in memory (e.g., coordinates (i,j) of a product code pre-designated to represent a row or a column).

In the foregoing description, various aspects of the present invention have been described. For purposes of explanation, specific configurations and details are set forth in order to provide a thorough understanding of the present invention. However, it will also be apparent to a person of ordinary skill in the art that the present invention may be practiced without the specific details presented herein. Furthermore, well-known features may be omitted or simplified in order not to obscure the present invention.

Unless specifically stated otherwise, as apparent from the foregoing discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

In accordance with any of the aforementioned embodiments of the invention, systems and methods may be software-implemented using dedicated instruction(s) or, alternatively, hardware-implemented using designated circuitry and/or logic arrays.

In accordance with any of the aforementioned embodiments of the invention, systems and methods may be executed using an article such as a computer or processor readable non-transitory storage medium, or a computer or processor storage medium, such as for example a memory (e.g. one or more memory unit(s) 122 and 124 of FIG. 1A or 178 and 182 of FIG. 1B), a disk drive, or a flash memory, for encoding, including or storing instructions which when executed by a processor or controller (e.g., one or more controller(s) or processor(s) 118 and 120 of FIG. 1A or 176 and 180 of FIG. 1B), carry out methods disclosed herein.

Different embodiments are disclosed herein. Features of certain embodiments may be combined with features of other embodiments; thus, certain embodiments may be combinations of features of multiple embodiments.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

The invention claimed is:

1. A method for decoding a product code comprising a plurality of first and second dimension codewords generated by encoding input data by a plurality of first and second dimension error correction codes, the method comprising:
   for each of a plurality of first dimension codewords:
      decoding the first dimension codeword using a first dimension error correction code decoder;
      erasing the first dimension codeword if errors are detected in the decoded first dimension codeword; and
   for each of a plurality of second dimension codewords:
      decoding the second dimension codeword using a second dimension erasure correction code decoder, wherein the first and second dimension codewords comprise first and second dimension redundancy generated using different types of the first and second dimension error correction codes in the first and second dimensions, respectively, wherein the second dimension codeword redundancy contains erasure correction parity to correct an erasure in the second dimension codeword that was erased in the first dimension decoding, wherein the input data are divided into a plurality of data blocks, wherein one or more first data blocks are encoded by both first dimension error correction codes and second dimension erasure correction codes and one or more second data blocks are encoded by first dimension error correction codes but not second dimension erasure correction codes.

2. The method of claim 1 comprising decoding the product code in two passes comprising decoding the first dimension codewords in a first pass and decoding the second dimension codewords in a second pass.

3. The method of claim 2, wherein the first pass decoding is an erasure insertion channel that inserts erasures into the second dimension codewords of the product code and the second pass decoding is an erasure recovery decoder that corrects the inserted erasures with the erasure correction codes.

4. The method of claim 2 comprising repeating one or more additional iterations of the first and second passes if one or more first dimension codewords contain errors after the first iteration of the first and second passes.

5. The method of claim 4 comprising using one or more different decoding algorithms in one or more different iterations.

6. The method of claim 1, wherein the first dimension is a row dimension and the second dimension is a column dimension.

7. The method of claim 1, wherein the first dimension is a column dimension and the second dimension is a row dimension.

8. The method of claim 1, wherein each data element in the first dimension input data is encoded by an intersecting orthogonal second dimension erasure correction code.

9. The method of claim 1 comprising, after the second dimension decoding corrects erasures in the first data block, repeating the first dimension decoding to propagate any corrected erasures to increase the probability of successfully decoding a first dimension codeword that had previously failed to decode.

10. The method of claim 1, wherein the product code comprises a stair-step arrangement of input data blocks and erasure error correction code blocks, wherein each sequential data block in the product code is encoded by an erasure code block of incrementally increasing or decreasing redundancy length.

11. The method of claim 10 comprising, after the second dimension decoding corrects erasures in a current data block, repeating the first dimension decoding to propagate any corrected erasures to increase the probability of successfully decoding a first dimension codeword that had previously failed.

12. The method of claim 11 comprising repeating the first and second dimension decoding for each sequential data block.

13. The method of claim 1, wherein the product code further comprises error detection code to determine if errors exist in the decoded first dimension codeword.

14. The method of claim 1, wherein the first dimension decoding is a maximum likelihood decoding, which determines, from multiple possible symbol values, a codeword that is most likely the sent codeword.

15. The method of claim 1, wherein the second dimension erasure decoding is performed by solving a system of p or fewer equations with a set of p or fewer unknows corresponding to erasures, wherein p represents a length of the erasure correction parity in the second dimension codeword.

16. The method of claim 1 comprising decoding the plurality of first dimension codewords in parallel.

17. The method of claim 1 comprising decoding a first dimension and a second dimension input codewords in parallel.

18. The method of claim 1, wherein the second dimension codeword is decoded only if a first dimension codeword that intersects the second dimension codeword is erased.

19. The method of claim 1, wherein the product code decodes data received over a communication channel at a telecommunications device.

20. The method of claim 1, wherein the product code decodes data stored on a memory device.

21. A method for generating the product code of claim 1 comprising:
   storing the input data in a matrix;
   encoding the input data in the second dimension to generate the plurality of second dimension erasure error correction codewords; and
   encoding the input data and the erasure error correction codes in the first dimension of the matrix to generate the plurality of first dimension error correction codewords.

22. The method of claim 21 comprising repeating one or more iterations of encoding the first and second dimension error correction codes, wherein in each iteration at least a portion of the output of a previous iteration is encoded by the second dimension erasure correction code followed by a reorganization of at least a portion of the input codewords and second dimension codewords that are encoded by the first dimension error correction code.

23. A system for decoding a product code generated by encoding input data by a plurality of first and second dimension error correction codes, the system comprising:
   one or more processors configured to:
      for each of a plurality of first dimension codewords:
         decode the first dimension codeword using a first dimension error correction code,
         erase the first dimension codeword if errors are detected in the decoded first dimension codeword, and for each of a plurality of second dimension codewords:
decode the second dimension codeword using a second dimension erasure correction code decoder, wherein the first and second dimension codewords comprise first and second dimension redundancy generated using different types of the first and second dimension error correction codes in the first and second dimensions, respectively, wherein the second dimension codeword redundancy contains erasure correction parity to correct an erasure in the second dimension codeword that was erased in the first dimension decoding, wherein the input data are divided into a plurality of data blocks, wherein one or more first data blocks are encoded by both first dimension error correction codes and second dimension erasure correction codes and one or more second data blocks are encoded by first dimension error correction codes but not second dimension erasure correction codes.

24. The system of claim 23 comprising a telecommunications device comprising one or more receivers to receive a distorted version of the product code transmitted by a transmitting telecommunications device over a communication channel.

25. The system of claim 23 comprising one or more memory devices to store the product code.

* * * * *